(12) United States Patent
Kawamura et al.

(10) Patent No.: US 7,204,887 B2
(45) Date of Patent: Apr. 17, 2007

(54) WAFER HOLDING, WAFER SUPPORT MEMBER, WAFER BOAT AND HEAT TREATMENT FURNACE

(75) Inventors: Keisuke Kawamura, Futtsu (JP);
Tsutomu Sasaki, Futtsu (JP); Atsuki Matsumura, Futtsu (JP); Atsushi Ikari, Futtsu (JP); Isao Hamaguchi, Futtsu (JP); Yoshiharu Inoue, Futtsu (JP); Koki Tanaka, Futtsu (JP); Shunichi Hayashi, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 10/149,939

(22) PCT Filed: Oct. 16, 2001

(86) PCT No.: PCT/JP01/09081

§ 371 (c)(1),
(2), (4) Date: Jun. 14, 2002

(87) PCT Pub. No.: WO02/33743

PCT Pub. Date: Apr. 25, 2002

(65) Prior Publication Data

US 2003/0029570 A1 Feb. 13, 2003

(30) Foreign Application Priority Data

Oct. 16, 2000 (JP) .............................. 2000-315553
Oct. 25, 2000 (JP) .............................. 2000-326003

(51) Int. Cl.
*H01L 21/00* (2006.01)
*C23C 16/00* (2006.01)

(52) U.S. Cl. ................. 118/725; 118/728; 118/724; 206/832; 219/444.1; 219/544; 392/416; 392/418; 432/5; 432/152; 432/241; 432/253; 432/258; 432/259

(58) Field of Classification Search .............. 118/725, 118/728, 724; 432/5, 152, 241, 253, 258, 432/259; 219/444.1, 544; 206/832; 392/416, 392/418

See application file for complete search history.

(56) References Cited

U.S. PATENT DOCUMENTS 5,709,543 A * 1/1998 Shimazu .................... 432/241

(Continued)

FOREIGN PATENT DOCUMENTS

JP 6-163444 6/1994

(Continued)

*Primary Examiner*—Ram N. Kackar
(74) *Attorney, Agent, or Firm*—Kenyon & Kenyon LLP

(57) ABSTRACT

The present invention provides a wafer holder, a wafer support member, a wafer boat and a heat treatment furnace, which are capable of sufficiently suppressing slip dislocations, without lowering productivity and at low cost, in the high temperature heat treatment of silicon wafers, and said wafer holder is characterized in that: the wafer holder is composed of a wafer support plate and three or more wafer support members mounted on said wafer support plate, each of the wafer support members having a wafer support portion or more; at least one of said wafer support members is a tilting wafer support member which has a plurality of upward-convex wafer support portions on the upper surface and is tiltable with respect to said wafer support plate; and the wafer is supported by at least four wafer support portions.

11 Claims, 14 Drawing Sheets

U.S. PATENT DOCUMENTS 5,718,574 A * 2/1998 Shimazu ..................... 432/253
5,820,367 A * 10/1998 Osawa ....................... 432/253
6,062,853 A * 5/2000 Shimazu et al. ............ 432/258

FOREIGN PATENT DOCUMENTS

| JP | 6-333914 | 12/1994 |
| JP | 9-129567 | 5/1997 |
| JP | 10-284429 | 10/1998 |
| JP | 11-40569 | 2/1999 |
| JP | 11-40659 | 2/1999 |
| JP | 2000-91406 | 3/2000 |
| JP | 2000091406 A * | 3/2000 |
| JP | 2000-150402 | 5/2000 |
| JP | 2000150402 A * | 5/2000 |

* cited by examiner

WAFER HOLDING, WAFER SUPPORT MEMBER, WAFER BOAT AND HEAT TREATMENT FURNACE

TECHNICAL FIELD

This invention relates to a wafer holder, a wafer support member, a wafer boat and a heat treatment furnace suitable for the heat treatment of silicon wafers and, especially, for the high temperature heat treatment employed in the production of SIMOX (Separation by IMplanted OXygen) wafers, annealed wafers and the like.

BACKGROUND ART

A vertical-type heat treatment furnace has come to be used as the heat treatment apparatus of silicon wafers in view of the recent trend toward larger diameter silicon wafers. A vertical wafer boat having a plurality of vertical support columns is installed in the vertical type heat treatment furnace, and the wafers are heat-treated after being inserted in a plurality of support grooves cut in the inside walls of the support columns. By this supporting method, however, each wafer is supported by wafer support parts disposed along the outermost periphery of the wafer, and the weight of the wafer is imposed on the wafer only at the vicinity of the support parts in a concentrated manner. As a consequence, a large bending stress is imposed on the wafer at the vicinity of the support parts during the high temperature heat treatment employed in the production of the SIMOX wafers, annealed wafers and the like, and, if the stress exceeds the yield stress of the silicon wafer at the temperature of the heat treatment, there is a problem that defects called slip dislocations occur inside the wafer during the heat treatment.

For solving that problem, conventionally, a method of increasing the area for supporting a wafer and thus suppressing the occurrence of the slip dislocations by inserting a wafer support plate 6 in the support grooves 3 of a plurality of support columns 2 of a wafer boat 1 and placing a wafer thereon, as seen in FIG. 21, is used. Heat treatment is then applied. Further, by forming a notch 7 concavely in the wafer support plate, it is possible to apply a wafer conveying apparatus of a system of holding a wafer on its bottom surface by a vacuum chuck and conveying it, and thus high productivity through the high-speed loading and unloading of the wafer is realized.

Even by this technology, however, the occurrence of slip dislocations is not suppressed sufficiently. In the technology, the wafer support plate deforms during the heat treatment because the wafer support plate is not symmetrical with respect to its center and is supported, by the support columns 2, asymmetrically. What is more, the frictional force between the silicon wafer and the wafer support plate increases due to an increase in the contact area between the silicon wafer and the wafer support plate. For these reasons, the stress caused by the thermal deformation of the wafer support plate is transferred to the silicon wafer more easily and thus the slip dislocations occur more easily.

To solve these problems, Japanese Unexamined Patent Publication No. 2000-91406 proposes a wafer holder wherein three silicon balls 12 acting as wafer support members are placed on a wafer support plate 11 without a notch and a silicon wafer 10 is supported at the three points by the silicon balls, as shown in FIG. 22. By this method, the thermal deformation of the wafer support plate is comparatively small because there is no notch in the wafer support plate. Further, the supporting of the wafer at the points alleviates the frictional force between the wafer and the wafer support plate when the heat treatment is done in a non-oxidizing atmosphere in which the silicon balls and the silicon wafer do not weld together. Therefore, the slip dislocations of the wafer caused by the thermal deformation of the wafer support plate can be suppressed.

Even by this technology, however, the silicon balls still weld with the silicon wafer during the heat treatment in an oxidizing atmosphere employed for the production of SIMOX annealed wafers, and the slip dislocations of the wafer caused by the thermal deformation of the wafer support plate cannot be suppressed sufficiently. Besides, as the wafer support plate does not have a notch, the wafer conveying apparatus tends to be large, and the wafer charging and discharging movements of the wafer conveying apparatus requires large spaces above and beneath the wafer support plate. As a result, the wafer conveying movements of the wafer conveying apparatus become complicated and the wafer conveying time becomes longer and, therefore, the productivity of the heat treatment furnace per batch is lowered. A yet more serious problem is that, using this technology, one third of the weight of the wafer is concentrated at a support part, and the stress resulting from the wafer weight causes the slip dislocations of the wafer at the supported portions of the wafer. In view of the recent trend of increasing the diameter of a silicon wafer and the consequent heavier wafer weight, it is clear that the problem of the slip dislocations will become more and more serious, as long as the above method of distributing the wafer weight to only three points of the wafer support parts is employed.

Methods for preventing the occurrence of the slip dislocations without using a wafer support plate have been proposed. An example is the method disclosed in Japanese Unexamined Patent Publication No. H11-40659, wherein four wafer support parts per wafer are provided in a wafer boat. In this case, since there are four support parts to bear the wafer weight, the stress caused by the weight of the silicon wafer at each of the supported portions is smaller than in the case that the wafer weight is borne by three wafer support parts of a similar shape.

By this method, however, it is necessary that the heights of all the four support parts have to be within a tolerance of 30 μm, and there are problems that it is extremely difficult to fabricate a wafer boat having such a dimensional accuracy and that it is very costly. The fabrication of a wafer boat having five or more support parts per wafer is more difficult if the support parts have to have a height accuracy equal to or better than the above. Thus, there is a problem that the number of the wafer support parts cannot be increased easily. Needless to say, the same problem still persists when the number of the silicon balls placed on the wafer support plate used in the method disclosed in the Japanese Unexamined Patent Publication No. 2000-91406 is increased to four or more.

In the heat treatment of silicon wafers, especially the high temperature heat treatment employed in the production of SIMOX wafers, annealed wafers and the like, suppressing the slip dislocations satisfactorily using an economical wafer holder without deteriorating productivity is, therefore, an important challenge to be solved for improving the production yield of the silicon wafers. What is necessary in order to solve the challenge is a wafer holder satisfying either of the following two requirements:

(1) a wafer holder is structured so as to support a wafer at points in order to alleviate the stress caused by the thermal deformation of a wafer support plate, and so as to support the wafer with four or more wafer support parts in order to suppress the stress caused by the wafer weight; and (2) if a wafer is supported by a face or faces, the thermal deformation of a wafer support plate is small enough not to affect the wafer.

It is necessary for the wafer holder to further satisfy the following requirements:

(3) a wafer holder has a notch so as to allow the use of a wafer conveying apparatus of a system to hold a wafer on its bottom surface by a vacuum chuck and convey it in order to maintain high productivity;

(4) a wafer holder is made of a material which does not weld with a silicon wafer during heat treatment in order to prevent the occurrence of slip dislocations caused by the welding; and so forth.

In addition, a wafer boat and a heat treatment furnace incorporating the wafer holder satisfying the above requirements are necessary. However, as described above, none of conventional technologies is capable of solving the above problems.

The object of the present invention, therefore, is to solve the above problems and provide a wafer holder, a wafer support member, a wafer boat and a heat treatment furnace suitable for the high temperature heat treatment of a silicon wafer.

DISCLOSURE OF THE INVENTION

The inventors of the present invention earnestly examined the methods of supporting silicon wafers suitable for the heat treatment of the silicon wafers and, especially, the high temperature heat treatment employed in the production of SIMOX wafers, annealed wafers and the like, satisfying the requirements (1), (3) and (4), or the requirements (2), (3) and (4) stated above.

In the first place, as a result of the studies into the materials of a wafer holder satisfying the above requirement (4), the present inventors discovered materials of the wafer holder which prevent the welding of the silicon wafer.

Then, the present inventors vigorously carried out many studies on the structure of a wafer holder satisfying the above requirement (1). The most challenging task of the studies was to work out a wafer holder structure that could permit a dimensional deviation exceeding 30 μm in order to enable the fabrication of a wafer holder satisfying the requirements in an industrial scale and at low costs and further could permit the heights of all the four or more wafer support parts to be adjusted within the tolerance of 30 μm.

After many studies, the present inventors hit on the concept that a wafer holder satisfying the above requirements (1) and (3) could be obtained by adopting a structure in which a plurality of wafer support members, each having a wafer support portion or wafer support portions, were mounted on a tabular wafer support plate having a notch, and further each of one or more of said wafer support members had a plurality of upward-convex wafer support portions on the upper surface thereof and was made tiltable with respect to the wafer support plate.

The most significant characteristic of a wafer holder according to the present invention is that said one or more wafer support members having upward-convex wafer support portions on the upper surface(s) is/are tiltable on a wafer support plate. By the function of the wafer support member(s) being tiltable, each of the upward-convex wafer support portions moves into contact with the bottom surface of a wafer and, therefore, even when there is a deviation larger than 30 μm in the dimensions of the wafer support plate and the wafer support members and the heights of the wafer support portions are not uniform, it becomes possible to support the wafer with four or more wafer support portions by the self-adjusting mechanism of the tilting support member(s).

The present inventors further studied a different structure of a wafer holder suitable for the above requirements (1) and (3) and, as a result, obtained the concept that a wafer holder satisfying the requirements could be fabricated by providing the wafer support members, to support a wafer, with a self-adjusting height control function.

The present inventors actually fabricated wafer holders based on the above two ideas and conducted high temperature heat treatment of silicon wafers using the fabricated wafer holders. As a result, they confirmed that the occurrence of the slip dislocations caused by both the weight of the wafer and the thermal deformation of the wafer support plate could be suppressed.

The present inventors also earnestly studied the structure of a wafer holder satisfying the requirements (2) and (3) and, as a result of close examination into the relation between the structure of a wafer holder and the occurrence of slip dislocations during heat treatment, discovered the following: the larger the contact area of the wafer with the wafer holder, the larger the number of contact portions where the welding of the wafer and the wafer holder occurred during the heat treatment; but, even when the welding occurred, the smaller the deformation of the wafer holder during the heat treatment, the less the slip dislocations occurred; and, as a conclusion, the slip dislocations could be prevented from occurring by suppressing the deformation of the wafer holder during the heat treatment.

Based on the above findings, the present inventors invented a wafer holder having sufficiently small deformation during heat treatment. Then, they actually manufactured the invented wafer holder and carried out the high temperature heat treatment of silicon wafers using the fabricated wafer holder. As a result, they confirmed that the occurrence of the slip dislocations caused by both the weight of the wafer and the thermal deformation of the wafer support plate could be suppressed.

Through a combination of the above study results, the present inventors successfully designed wafer holders for silicon wafers capable of preventing slip dislocations from occurring during high temperature heat treatment of the silicon wafers, while maintaining a low cost and high productivity. The present invention, which was established on the basis of the above findings, is constructed as follows:

(1) A wafer holder to hold a wafer on the upper surface characterized in that: the wafer holder comprises a wafer support plate and three or more wafer support members mounted on said wafer support plate, each having one or more wafer support portions; at least one of said wafer support members is a tilting wafer support member which has a plurality of upward-convex wafer support portions on the upper surface and is tiltable with respect to the wafer support plate; and the wafer is supported by at least four wafer support portions.

(2) A wafer holder according to the item (1), characterized in that the tilting wafer support member comprises: a tabular member; a fulcrum provided substantially at the center of the bottom surface of the tabular member and contacting with said wafer support plate at a point or along a line; and upward-convex wafer support portions provided on the upper surface of the tabular member and on both sides of the fulcrum contacting with the wafer support plate.

(3) A wafer holder according to the item (1), characterized in that the tilting wafer support member comprises: a tabular member; a fulcrum provided substantially at the center of the bottom surface of the tabular member and contacting with said wafer support plate at a point; and three upward-convex wafer support portions provided on the upper surface of the tabular member.

(4) A wafer holder to hold a wafer on the upper surface characterized by comprising: a wafer support plate; three or more wafer support members placed on said wafer support plate, at least one of which is a tilting wafer support member having a flat upper surface and a fulcrum provided substantially at the center of the bottom surface and contacting the wafer support plate at a point or along a line and being tiltable with respect to the wafer support plate; and at least one tilting wafer support member placed on the flat upper surface of said tilting wafer support member having one or more tabular members, a fulcrum provided substantially at the center of the bottom surface of said tabular member and contacting with said tilting wafer support member at a point or along a line, and a plurality of upward-convex wafer support portions provided on the upper surface of said tabular member.

(5) A wafer holder according to any one of the items (1) to (4), characterized in that each of the wafer support portions of the wafer support members supports the wafer at a point.

(6) A wafer holder according to the item (5), characterized in that the structure of a wafer support portion to support a wafer at a point has a spherical surface having a radius of curvature of 100 mm or less.

(7) A wafer holder according to any one of the items (1) to (6), characterized in that the material of the wafer support members is any one selected from SiC, $Si_3N_4$, $SiO_2$ and Si, or a combination thereof.

(8) A wafer holder according to any one of the items (1) to (7), characterized in that the material of the wafer support portions of the wafer support members is SiC and/or $Si_3N_4$.

(9) A wafer support member placed on a wafer support plate of a wafer holder and holding a wafer on the upper surface, characterized in that: said wafer support member comprises three structures of an upper structure, a middle structure and a lower structure; and at least the middle structure is composed of a material that softens at the temperature of the heat treatment of the wafer.

(10) A wafer support member according to the item (9), characterized in that each of the upper and lower structures of said wafer support member has a convex portion which contacts with the wafer or the wafer holder at a point.

(11) A wafer support member according to the item (10), characterized in that each of the convex portions, which contact with the wafer or the wafer holder at a point, of the upper and lower structures of said wafer support member has a spherical surface having a radius of curvature of 100 mm or less.

(12) A wafer support member according to any one of the items (9) to (11), characterized in that the material of the upper and lower structures of said wafer support member is: any one selected from SiC, $Si_3N_4$, and Si coated with SiC and/or $Si_3N_4$ on the surface; or a combination thereof.

(13) A wafer support member according to the item (9), characterized in that the material of the middle structure of said wafer support member is quartz glass.

(14) A wafer holder to hold a wafer on the upper surface characterized in that: said wafer holder comprises a wafer support plate and n or more pieces of wafer support members placed on the wafer support plate; and at least n−2 pieces of said wafer support members are the wafer support members according to any one of the items (9) to (13) wherein n is an integer not smaller than 4.

(15) A wafer holder according to any one of the items (1) to (8) and (14), characterized in that the wafer support plate of said wafer holder is a circular plate with a notch.

(16) A wafer holder to hold a wafer characterized by comprising a wafer support plate on the upper surface of which an annular upward-convex wafer support portion with a flat upper surface is formed and a depression for enabling the vertical movement of a conveying chuck for loading wafers is formed in the direction of the radius.

(17) A wafer holder to hold a wafer characterized by: comprising a wafer support plate on the upper surface of which an annular upward-convex wafer support portion with a flat upper surface is formed and a notch is formed in the direction of the radius of said wafer support plate; and having a reinforcing structure formed perpendicularly to the wafer loading surface and along the edge of the notch.

(18) A wafer holder according to the item (16) or (17), characterized in that the tabular wafer support plate of said wafer holder has, in addition, one or more of reinforcing ribs formed concentrically with said annular upward-convex wafer support portion.

(19) A wafer holder according to any one of the items (1) to (8) and (14) to (18), characterized in that the material of the tabular wafer support plate of said wafer holder is: any one selected from SiC, $Si_3N_4$, $SiO_2$, Si and Si coated with SiC and/or $Si_3N_4$ on the surface; or a combination thereof.

(20) A wafer boat to hold a plurality of wafers characterized by comprising: at least two fixed members; a plurality of support columns placed between the fixed members and substantially in parallel with each other; a plurality of support grooves formed in the support columns; and the wafer holders according to any one of the items (1) to (8) and (14) to (19) horizontally inserted in and held by the support grooves.

(21) A heat treatment furnace for wafers characterized by being equipped with a wafer boat according to the item (20).

BEST MODE FOR CARRYING OUT THE INVENTION

Figure 1:
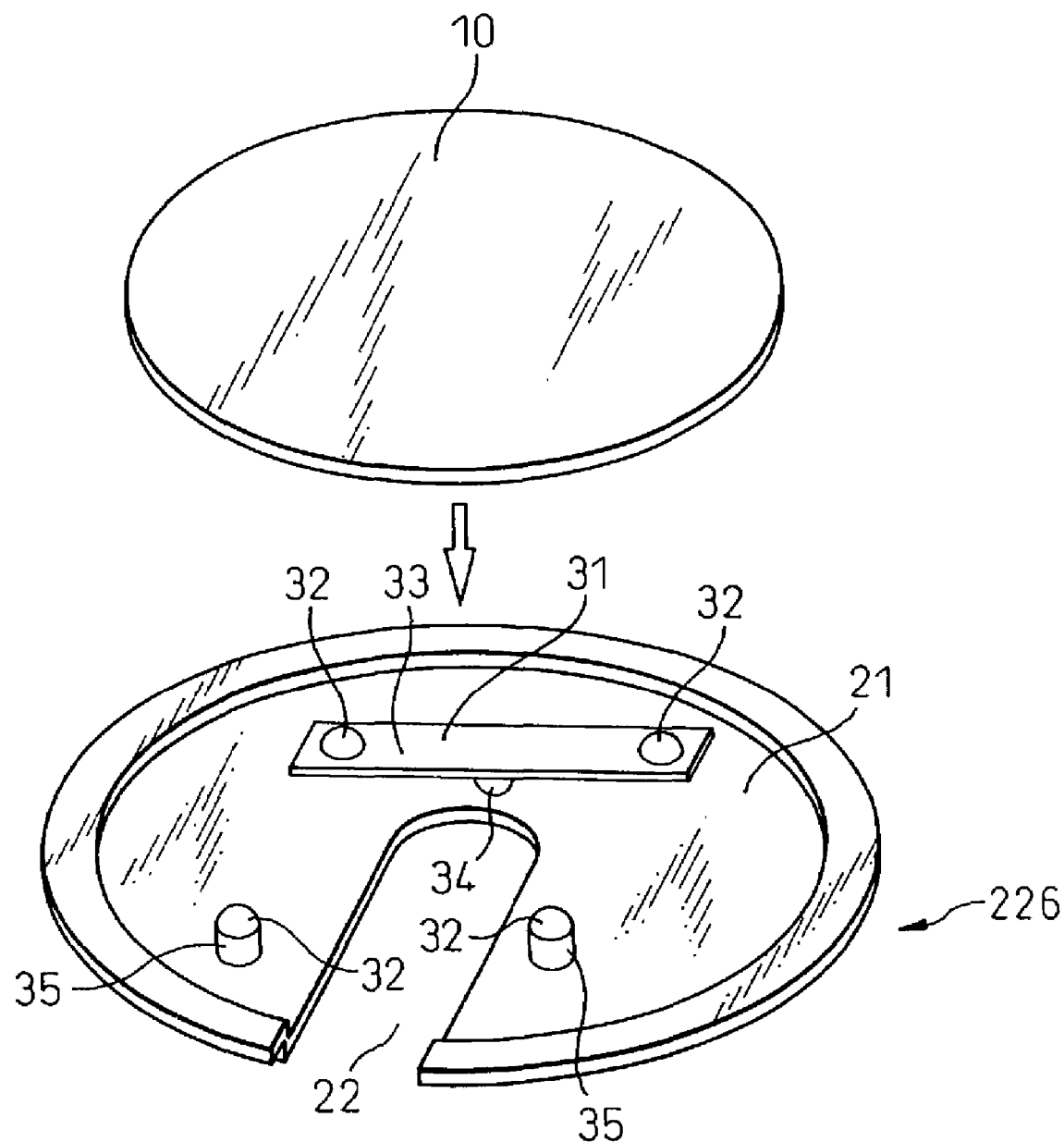
FIG. 1 is a perspective view of the first embodiment of a wafer holder according to the present invention.

Embodiments of the present invention are explained hereafter by referring to the attached drawings.

The first wafer holder according to the present invention is a tabular wafer holder composed of, as shown in FIGS. 1 to 4, for example: a disc-shaped wafer support plate 21; and three or more wafer support members 31, 35, 41 and 51 placed on the wafer support plate 21, each having a wafer support portion or wafer support portions on the upper surface.

In the above case, the material used for the wafer support plate 21 is generally SiC, $SiO_2$ or Si. In order that a wafer conveying apparatus of a system can hold a wafer on its bottom surface by a vacuum chuck and convey the wafer, it is desirable that the wafer support plate 21 has a notch 22 at the position where the vacuum chuck is inserted. The wafer support plate 21 may have a shape other than the disc shape, as required, as long as it can accommodate three or more wafer support members on the upper surface and has a notch 22. Further, drilling, spot facing or some other work may be applied to the upper surface of a wafer support plate 21 at a position where a tilting wafer support member is placed as explained later as long as the work does not hinder the movability of a tilting wafer support member, for the purpose of the positioning of the tilting wafer support member or otherwise, as required.

At least one of the three or more wafer support members 31, 35, 41 and 51 having a wafer support portion or wafer support portions on the upper surface as shown in FIGS. 1 to 4 is designed to be a tilting wafer support member having a plurality of upward-convex wafer support portions 32 on the upper surface and being tiltable with respect to the wafer support plate, as shown in FIGS. 5(a) to 5(c) and 6(a) and 6(d). Otherwise, at least one of said three or more wafer support members is designed, as shown in FIGS. 7(a) and 7(b) for example: to be a tilting support member 51 or 61 having a flat upper surface and being tiltable with respect to the wafer support plate; and, further, to have one or more tilting wafer support members 31 or 41 on the flat upper surface of said tilting support member, which tilting wafer support members have a plurality of upward-convex wafer support portions and are tiltable with respect to the upper surface of said tilting support member.

Figure 8:
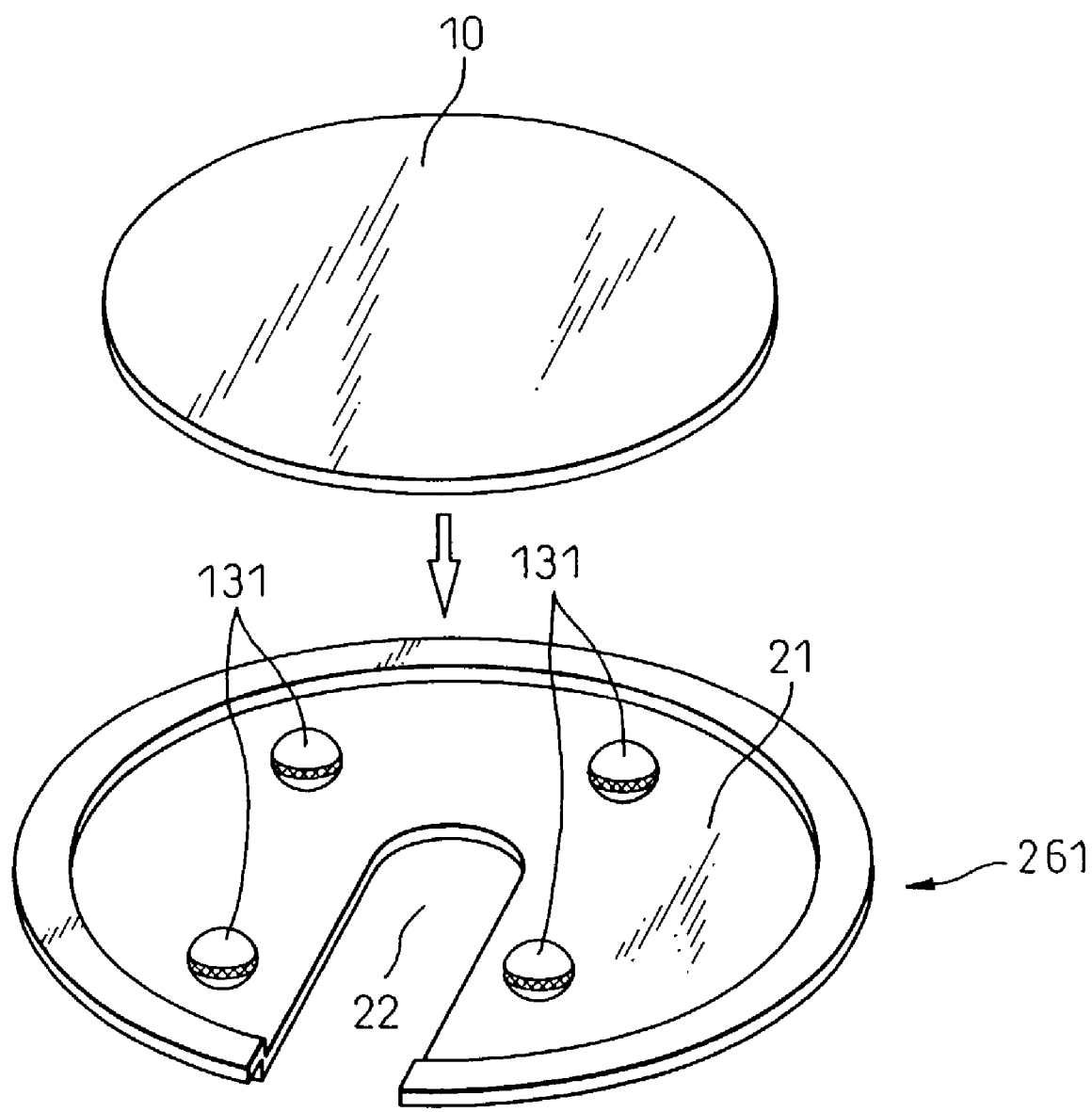
FIG. 8 is a perspective view of the fifth embodiment of a wafer holder according to the present invention.
Figure 9:
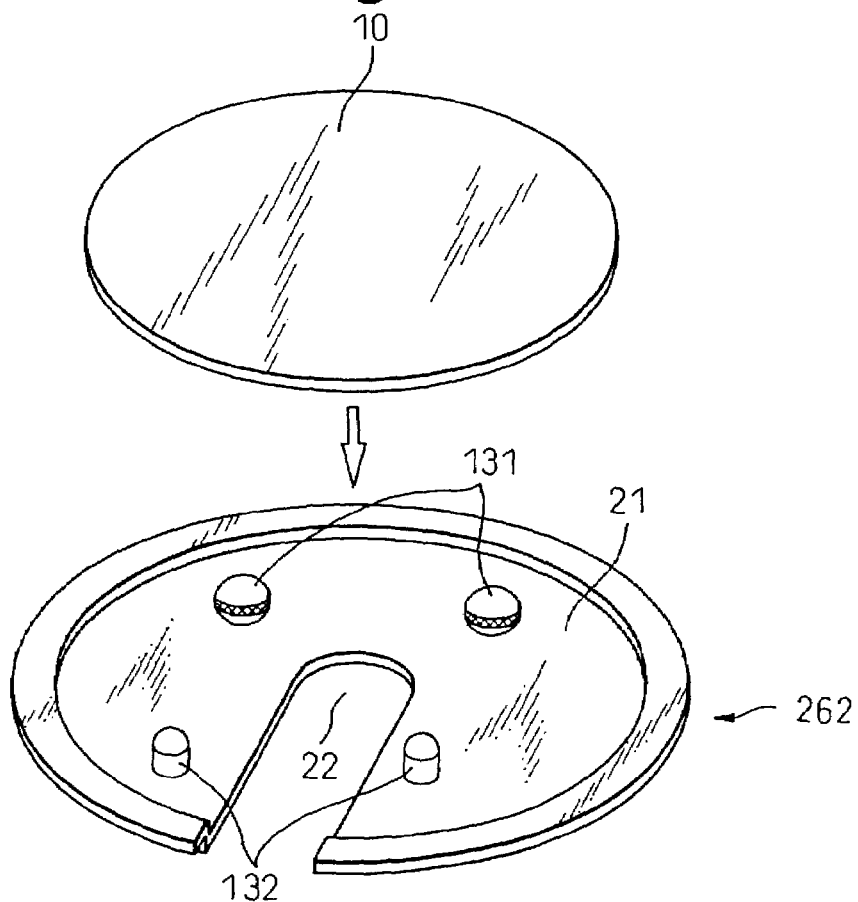
FIG. 9 is a perspective view of the sixth embodiment of a wafer holder according to the present invention.

The second wafer holder according to the present invention is composed of: a tabular wafer support plate 21; and four or more wafer support members 131 and/or 132 having wafer support portions at their upper portions and placed on the wafer support plate 21, as shown in FIGS. 8 and 9 for example. A wafer support member 131 is composed of three main structures: an upper structure, a middle structure and a lower structure. Each of the upper and lower structures is composed of a member being made of a material capable of maintaining rigidity to withstand the weight of a silicon wafer during annealing treatment. The middle structure, on the other hand, is composed of a member being made of a material which has rigidity to withstand the weight of a silicon wafer at room temperature but softens at a high temperature during annealing.

Figure 12:
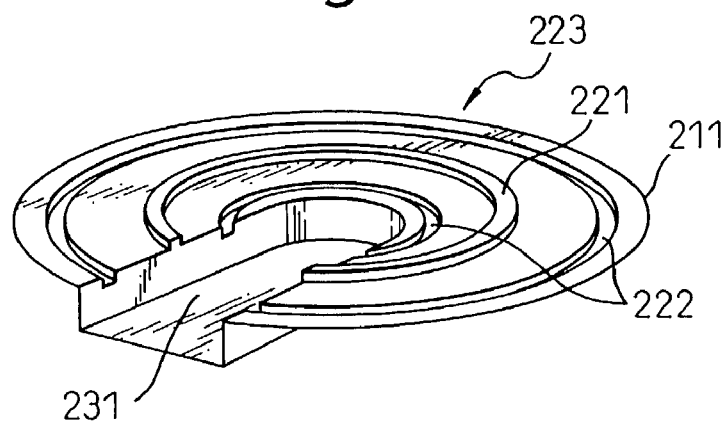
FIG. 12 is a perspective view of the seventh embodiment of a wafer holder according to the present invention.
Figure 13:
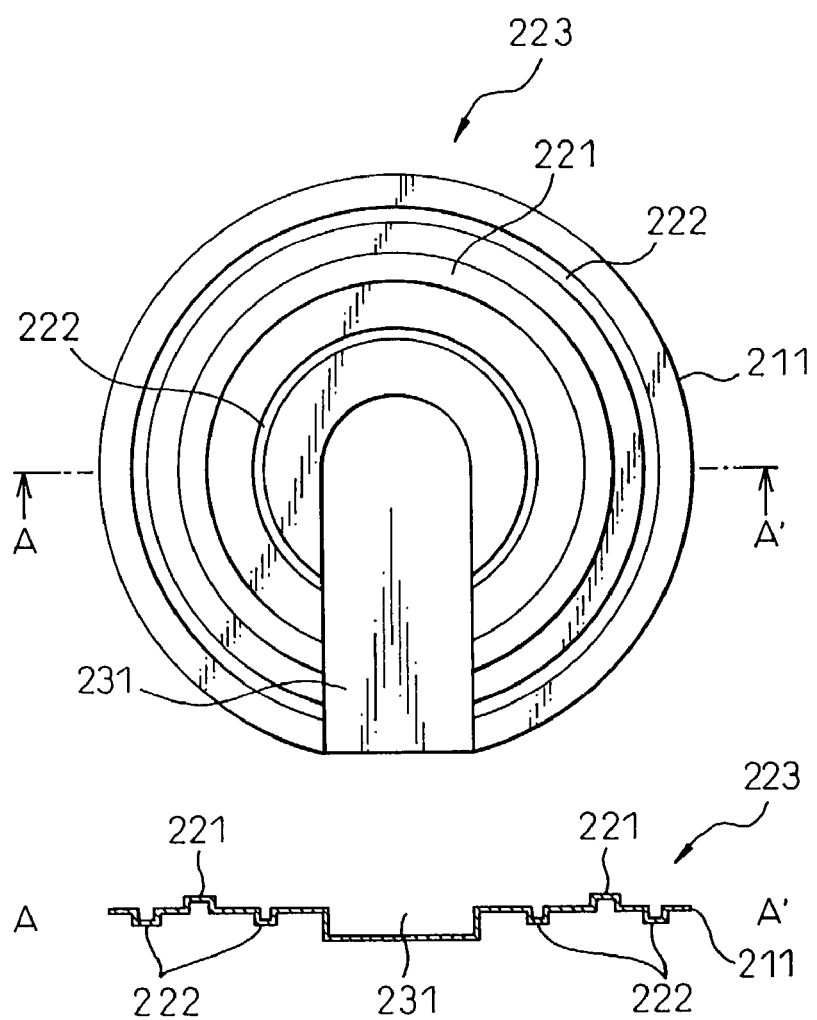
FIG. 13 consists of a plan view and a section view taken on line A–A' of the seventh embodiment of a wafer holder according to the present invention.

The third wafer holder according to the present invention is composed of a tabular wafer support plate, and, as shown in FIGS. 12 and 13, the almost circular wafer support plate 211 has: an annular upward-convex wafer support portion 221 having a flat upper surface; and a depression 231 running in the direction of the radius of the wafer support plate 211 and having a size (depth) which allows an automatic wafer conveying chuck to move vertically.

Figure 17:
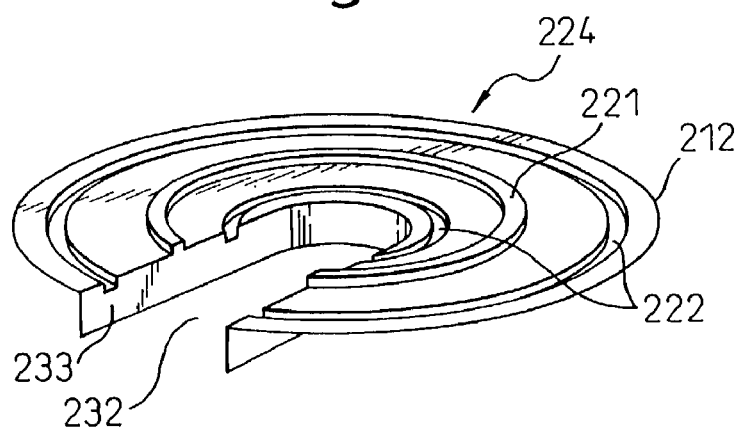
FIG. 17 is a perspective view of the eighth embodiment of a wafer holder according to the present invention.
Figure 18:
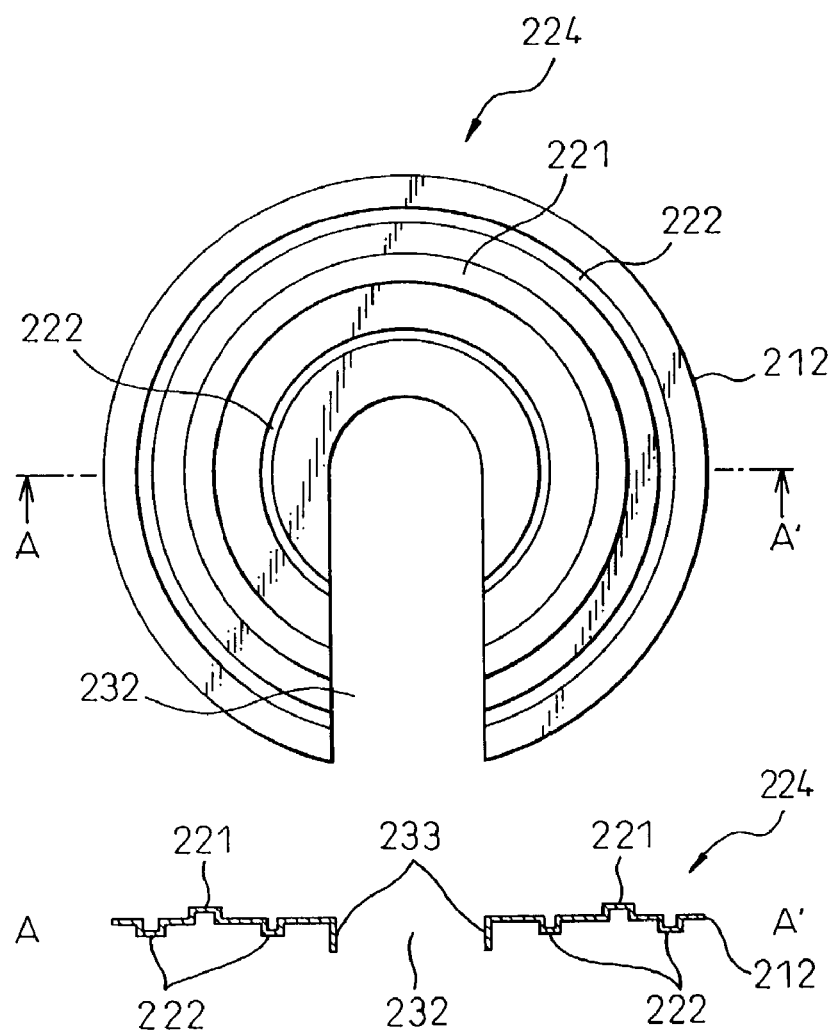
FIG. 18 consists of a plan view and a section view taken on line A–A' of the eighth embodiment of a wafer holder according to the present invention.

The fourth wafer holder according to the present invention is composed of a tabular wafer support plate, and, as shown in FIGS. 17 and 18, the almost circular wafer support plate 212 has: an annular upward-convex wafer support part

221 having a flat upper surface; a notch 232 which allows an automatic wafer conveying chuck to move vertically; and a tabular reinforcing structure 233 to suppress deformation during heat treatment. The reinforcing structure 233 is composed of a sheet formed perpendicularly to the wafer loading face of the wafer support plate.

The first to fourth wafer holders according to the present invention described above are inserted into and held horizontally in a wafer boat to support and hold a plurality of wafers, which wafer boat is installed in a semiconductor heat treatment furnace.

Figure 21:
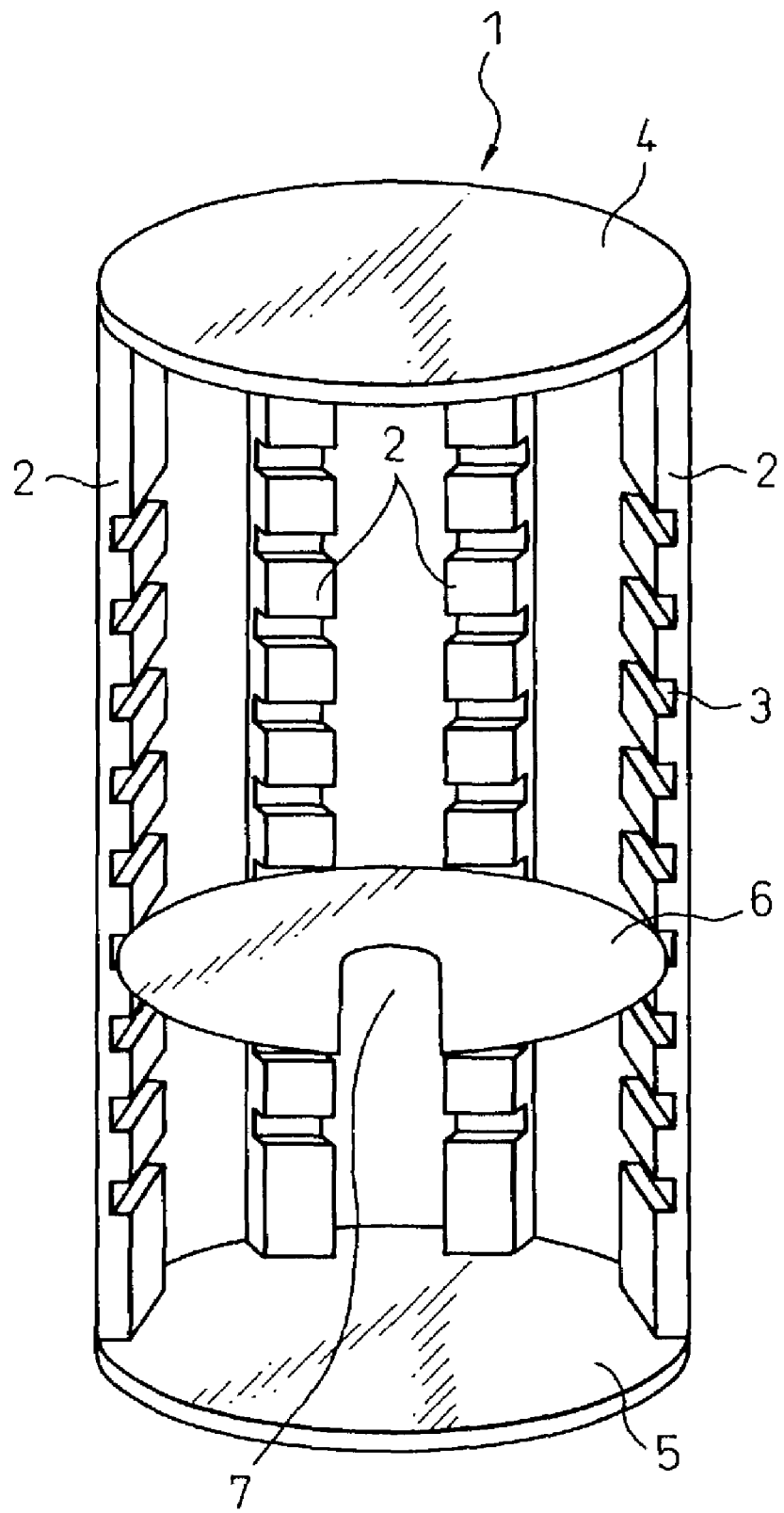
FIG. 21 is a perspective view of a vertical type wafer boat loaded with a wafer holder.

The wafer boat is composed of at least two fixed members 4 and 5 and a plurality of support columns 2 placed substantially in parallel with each other between the fixed members and having grooves 3 to support the wafer holders. An example of the wafer boat is a vertical boat 1 having three to four vertical support columns 2 as shown in FIG. 21. In this case, the tabular wafer holders according to the present invention are inserted into the grooves 3 for the wafer holders cut in the support columns 2. The vertical wafer boat is usually made of SiC, $SiO_2$ or Si.

After the wafer holders are supported horizontally in the wafer boat, a wafer is conveyed and loaded onto each of the wafer holders in the wafer boat by a wafer conveying apparatus equipped with a vacuum chuck.

In the cases of the first and second wafer holders according to the present invention, the conveyance and the loading of the wafers are done in the following manner: a wafer 10 is held on the bottom surface and conveyed horizontally to the upper portion of a wafer support plate 21 from the direction of the opening of the notch 22 by a wafer conveying apparatus equipped with a vacuum chuck; when the wafer 10 moves horizontally to a position where its center is roughly above the center of the wafer support plate 21, the vacuum chuck descends vertically; with this, the wafer 10 also descends vertically, the suction on the wafer by the vacuum chuck is released at this time and, as a result, the wafer 10 is loaded onto the wafer support plate 21 of the wafer holder, with the wafer support members in between; and thereafter, the vacuum chuck retracts from the opening of the notch 22 and then the next conveying procedures are ready to begin.

In the case of the third wafer holder according to the present invention, the conveyance and loading of a wafer to the wafer holder 223 of the wafer conveying apparatus are done in the following manner.

Figure 14:
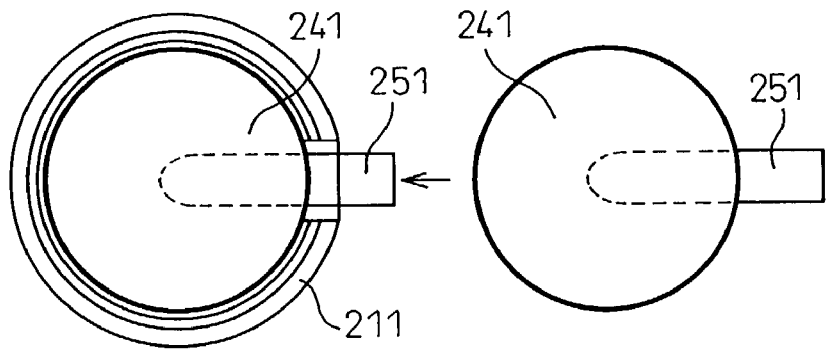
FIG. 14 consists of plan views showing a step of the procedures for loading a wafer onto a wafer holder according to the seventh embodiment of the present invention.

First, a wafer 241 is fixed onto an automatic wafer conveying chuck 251 by a method such as vacuum suction and is conveyed to right above the wafer holder 223 as shown in FIG. 14. At this stage, the wafer 241 and the automatic wafer conveying chuck 251 are above the wafer holder 211 leaving a clearance enough for the conveying movement as seen in FIG. 15(*a*).

Figure 15A:
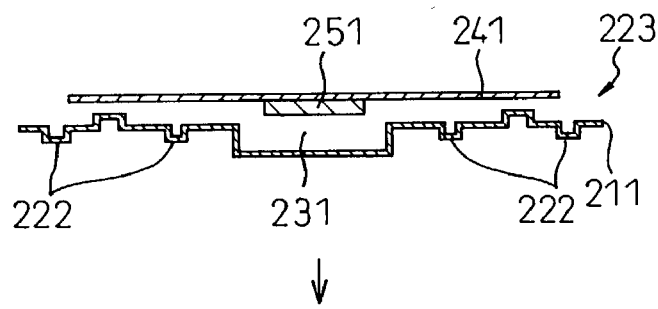
FIG. 15(a) is a section view showing a step of the procedures for loading a wafer onto a wafer holder according to the seventh embodiment of the present invention.
Figure 15B:
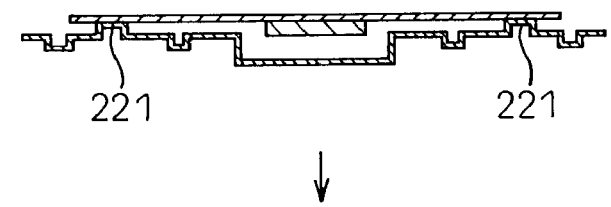
FIG. 15(b) is a section view showing another step of the procedures for loading a wafer onto a wafer holder according to the seventh embodiment of the present invention.
Figure 15C:
FIG. 15(c) is a section view showing yet another step of the procedures for loading a wafer onto a wafer holder according to the seventh embodiment of the present invention.

Next, the automatic wafer conveying chuck 251 holding the wafer 241 descends vertically until the bottom surface of the wafer 241 comes into contact with the upper surface of the upward-convex wafer support portion 221 of the wafer holder 211 as seen in FIG. 15(*b*).

Then, the automatic wafer conveying chuck 251 releases the suction on the wafer 241 and descends further to load the wafer 241 onto the wafer holder 223 as seen in FIG. 15(*c*).

Figure 16:
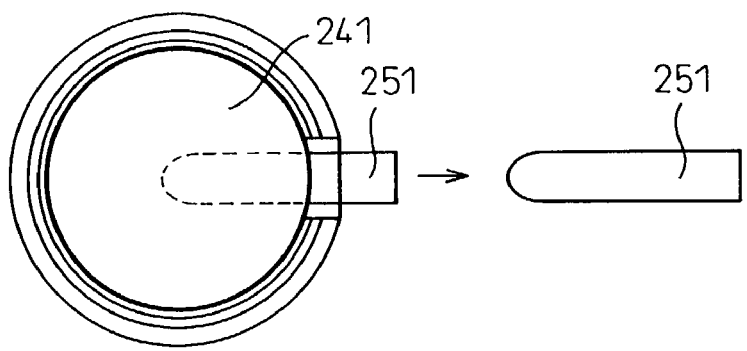
FIG. 16 consists of plan views showing yet another step of the procedures for loading a wafer onto a wafer holder according to the seventh embodiment of the present invention.

After that, the automatic wafer conveying chuck 251 retracts from the wafer holder 223 as shown in FIG. 16 and then next conveying procedure is ready to begin. The above wafer conveying procedure applies also to the fourth type tabular wafer holder according to the present invention.

The above-mentioned automatic wafer conveying procedure is the method employed in the case of the conventional technology in which a silicon wafer is supported directly by a wafer boat. This method can make the pitch of the grooves 3 for wafer holders smaller and does not adversely affect productivity compared with the method in which vertically moving pins and an automatic wafer conveying chuck are used in combination for conveying a wafer as disclosed in the Japanese Unexamined Patent Publication No. 2000-91406. Further, this method has a simple wafer conveying mechanism and therefore the method allows high-speed wafer conveyance and does not require a large wafer conveying apparatus.

After wafers are supported by wafer holders following the above procedures, a wafer boat such as a vertical wafer boat 1 is put into a heat treatment tube disposed inside a heat treatment furnace and then prescribed heat treatment is applied. The conditions of the heat treatment vary widely depending on the purpose but, in most cases, the furnace temperature during standby before the vertical wafer boat 1 is charged is within the range from 400 to 1,000° C., then the furnace temperature is raised at a heating rate of 0.1 to 20° C./min. or so, held at 400 to 1,400° C. for a prescribed period of time for the heat treatment, and then brought down back to the standby temperature at a cooling rate of 0.1 to 20° C./min. or so. The atmosphere inside the furnace consists usually of nitrogen, argon, hydrogen, oxygen, HCl, etc. or a mixture of these gasses.

With regard to the heat treatment of wafers, besides the above heat treatment with a vertical heat treatment furnace, there is another heat treatment called the Rapid Thermal Annealing/Oxidation (RTA/RTO) Treatment wherein wafers are rapidly heated and cooled after they are introduced in the furnace, and, needless to say, a wafer holder according to the present invention is also applicable to the RTA/RTO treatment.

After the heat treatment, the wafers are discharged from the heat treatment tube together with the vertical wafer boat 1. Then, the wafers are carried out horizontally from the wafer boat by operating the wafer conveying apparatus equipped with the vacuum chuck in the inverse order to the above described procedures employed when the wafers are loaded.

The wafer holding movements of the wafer holders according to the present invention and the effects are explained in more detail hereafter referring to the embodiments of the present invention shown in FIGS. 1 to 20.

In the first place, the wafer holding movements of the first wafer holder according to the present invention and the effects are explained in detail by referring to the embodiments of the present invention shown in FIGS. 1 to 7. In the case of the wafer holder 226 of the embodiment of the present invention shown in FIG. 1, three wafer support members in total are disposed on the wafer support plate 21, namely one tilting wafer support member 31 having upward-convex wafer support portions 32 at two positions on the upper surface, and two fixed wafer support members 35, each having a wafer support portion 32 at one portion on the upper surface. As is seen in FIGS. 1 and 5(*a*) to 5(*c*), an example of the desirable structure of a tilting wafer support member is that a tilting wafer support member 31, 36 or 38 is composed of: a tabular member 33; a fulcrum 34, 37 or 39 provided substantially at the center of the bottom surface of the tabular member and contacting with the wafer support plate at a point or along a line; and upward-convex wafer support portion 32 provided on the upper surface of the tabular member and on both sides of the fulcrum contacting with the wafer support plate.

In the wafer loading movements described above, the tilting wafer support member 31 moves like a balance around the fulcrum 34 by receiving the weight of a wafer loaded onto the wafer support portions 32. As a result, the two wafer support portions 32 of the tilting wafer support member 31 change their relative positions until every one of the four wafer support portions 32 shown in FIG. 1 contacts with the bottom surface of the wafer, and halt there.

By the above movement, it is possible to support a wafer 10 with four wafer support portions in a self-adjusting manner in the example shown in FIG. 1 even when the wafer support plates and wafer support members of the wafer holder have dimensional deviations larger than 30 μm and the heights of the wafer support parts are not uniform.

Further, by increasing the number of the tilting wafer support members disposed on a wafer support plate 21, it is possible to support a wafer with more wafer support portions than in the example shown in FIG. 1. In the case of the wafer holder 227 according to the embodiment of the present invention shown in FIG. 2, for instance, three tilting wafer support members 31 are disposed on the wafer support plate 21. In this case, when a wafer is loaded onto the wafer holder, each of the three tilting wafer support members 31 moves like a balance in the same manner as the embodiment of the present invention shown in FIG. 1. As a consequence, it is possible to support the wafer 10 with six wafer support portions in a self-adjusting manner even when the wafer holder and the wafer support members have dimensional deviations.

As explained above, the present invention makes it possible to support a wafer with four or more wafer support portions easily even when a low cost wafer support plate and wafer support members having large dimensional deviations are used. As a result, it becomes possible to fully alleviate the stress formed at the supported portions of the wafer caused by the weight of the wafer compared with the conventional techniques, and therefore the occurrence of the slip dislocations caused by the weight of the wafer is suppressed.

Note that four or more wafer support members may be disposed on a wafer support plate. In this case, the number of the fixed wafer support members disposed on the wafer support plate has to be two or less and the rest of the wafer support members must be tilting wafer support members, each having a plurality of upward-convex wafer support portions 32 on the upper surface. By doing so, among the four or more wafer support members, three or more of them are selected to support the wafer, depending on their dimensional deviations.

Here, if the number of fixed wafer support members mounted on a wafer support plate is set to be two or less, at least one tilting wafer support member is included among the three or more wafer support members to support a wafer as described above. Therefore, the wafer is supported by four or more wafer support portions, as in the embodiments of the present invention shown in FIGS. 1 and 2.

Figure 3:
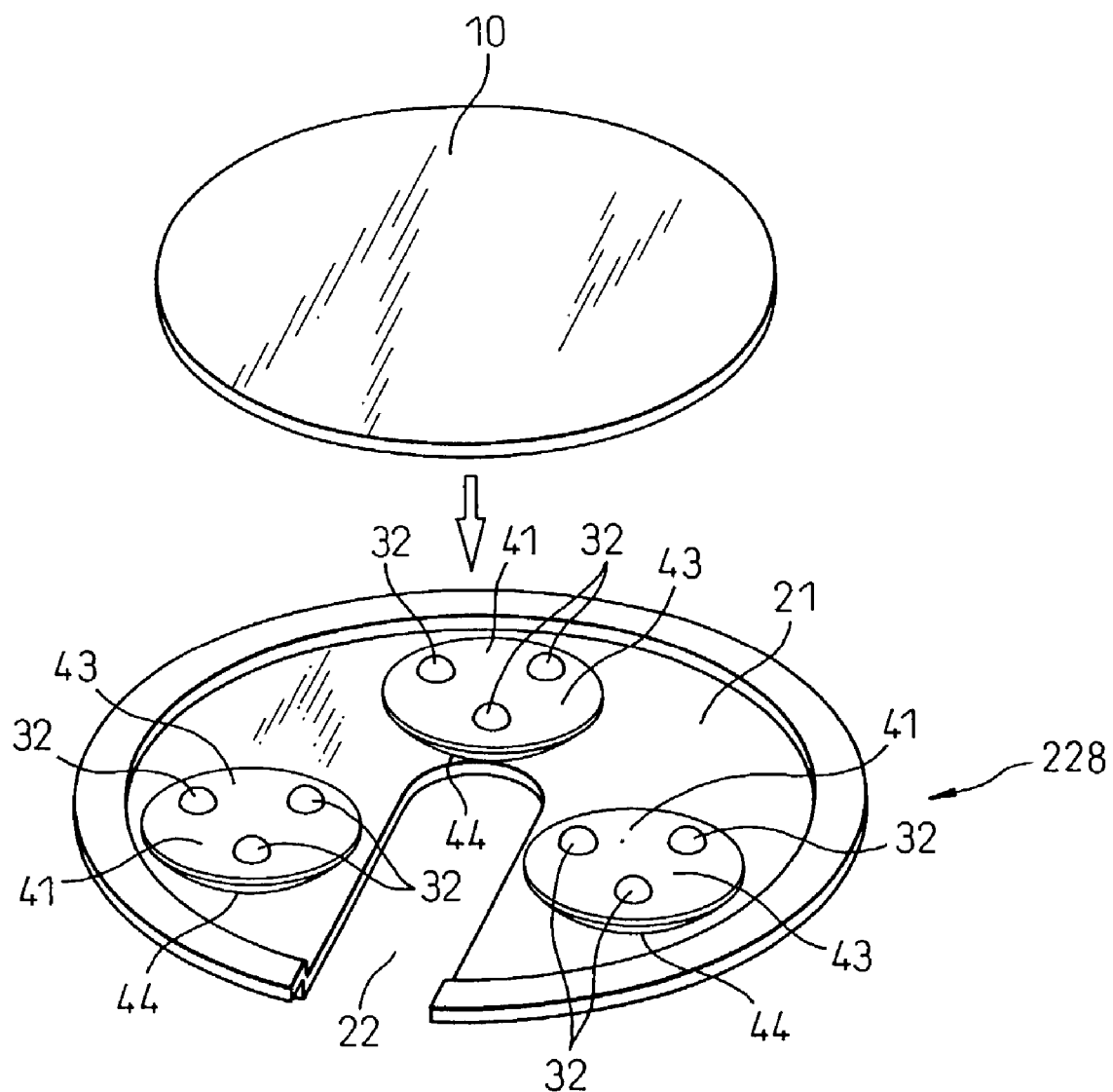
FIG. 3 is a perspective view of the third embodiment of a wafer holder according to the present invention.

FIG. 3 shows a different embodiment of the present invention using tilting wafer support members having another preferable structure. As seen in the wafer holder 228 of FIG. 3, each of the tilting wafer support members having another preferable structure is composed of: a tabular member; a fulcrum provided substantially at the center of the bottom surface of the tabular member and contacting with the wafer support plate at a point; and three upward-convex wafer support portions provided on the upper surface of the tabular member.

In the wafer loading movements described above, a tilting wafer support member 41 inclines slightly with respect to the wafer support plate 21 around the fulcrum 44 contacting with the wafer support plate at a point by receiving the weight of a wafer with the wafer support portions 32. As a result, in the case of the wafer holder according to the embodiment of the present invention shown in FIG. 3, the nine wafer support portions 32 shown in the figure change their relative positions until all of them contact with the bottom surface of the wafer and, then halt there. Thanks to the above movements, in the example of FIG. 3, it is possible to support the wafer 10 with nine wafer support portions in a self-adjusting manner even when the wafer support plate 21 and the tilting wafer support members 41 have dimensional deviations. As a result, it becomes possible to further alleviate the stress formed at the supported portions of the wafer caused by the weight of the wafer compared with the embodiments shown in FIGS. 1 and 2.

Figure 2:
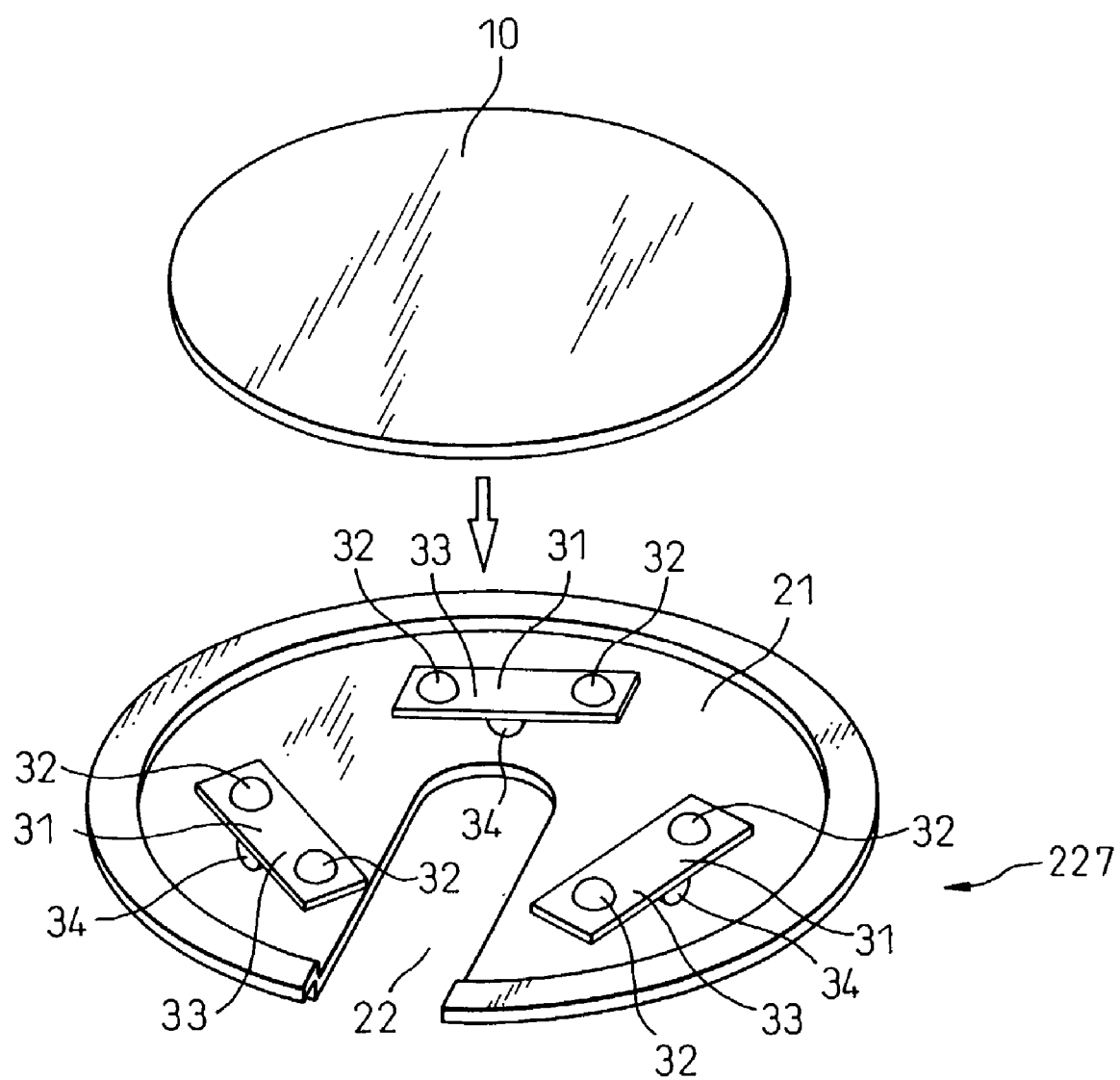
FIG. 2 is a perspective view of the second embodiment of a wafer holder according to the present invention.
Figure 5A:
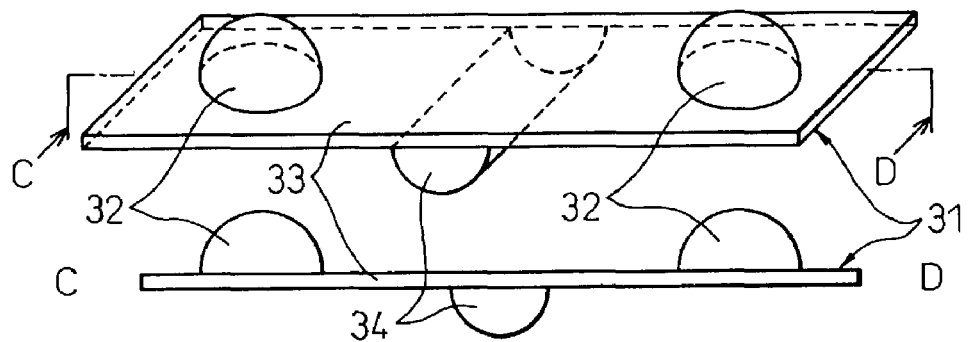
FIG. 5(a) consists of a perspective view and a section view taken on line C-D of a tilting wafer support member used in the first and second embodiments of wafer holders according to the present invention.
Figure 5B:
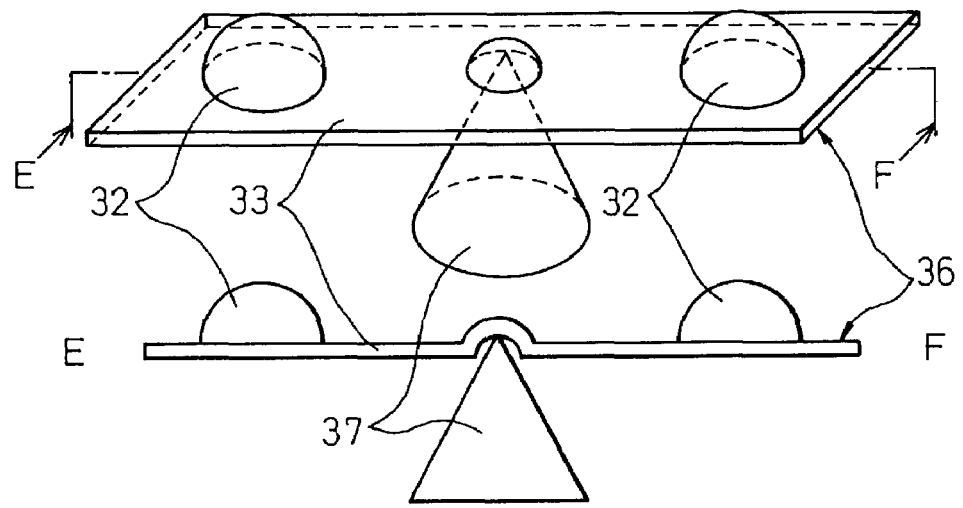
FIG. 5(b) consists of a perspective view and a section view taken on line E-F of a tilting wafer support member used in the first and second embodiments of wafer holders according to the present invention.
Figure 5C:
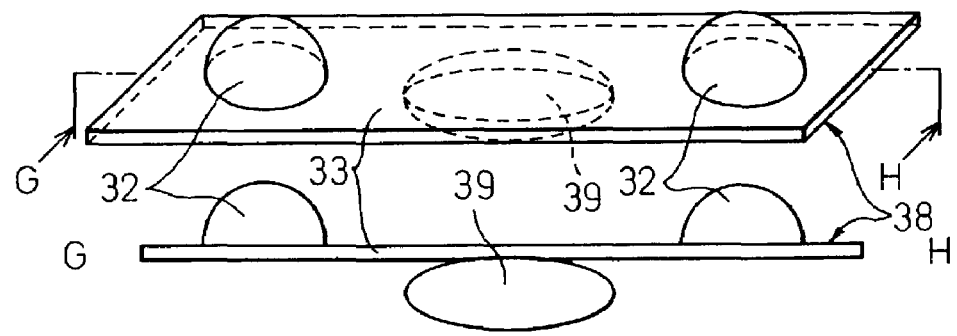
FIG. 5(c) consists of a perspective view and a section view taken on line G-H of a tilting wafer support member used in the first and second embodiments of wafer holders according to the present invention.

The tilting wafer support member 31 shown in FIG. 1 or 2 may be substituted with a tilting wafer support member of a system wherein a conical, spherical-surfaced or ellipsoidal depression is formed substantially at the center of the bottom surface of the tabular member 33 by spot facing work and the depression is held with a fulcrum 37 or 39 having a conical, spherical or ellipsoidal shape, like the tilting wafer support member 36 or 38 shown in FIG. 5(b) or 5(c). Further, the tilting wafer support member 41 shown in FIG. 3 may be substituted with a tilting wafer support member wherein the curvature of the fulcrum 47 provided at the center of the bottom surface of the tabular member 43 is smaller than that of the tilting wafer support member 41, as in the tilting wafer support member 46 shown in FIG. 6(b).

Figure 6A:
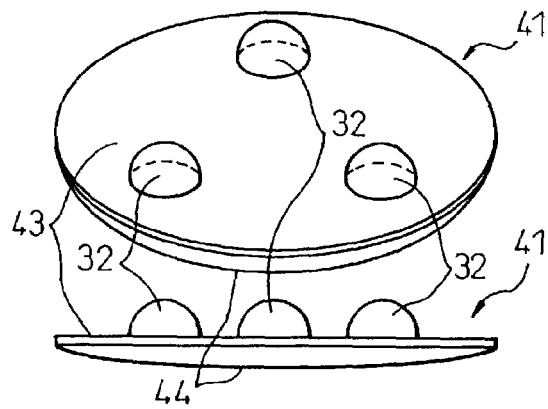
FIG. 6(a) consists of a perspective view and a side elevation view of a tilting wafer support member used in the third embodiment of a wafer holder according to the present invention.
Figure 6B:
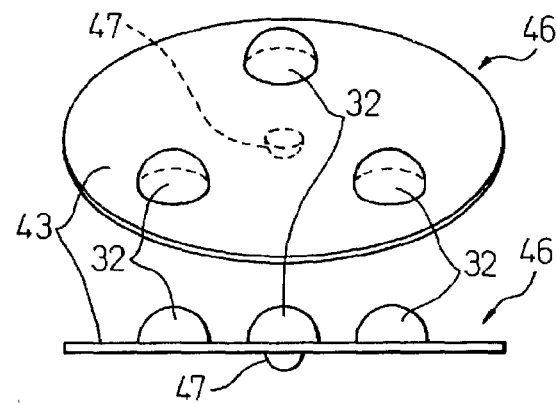
FIG. 6(b) consists of a perspective view and a side elevation view of a tilting wafer support member used in the third embodiment of a wafer holder according to the present invention.
Figure 6C:
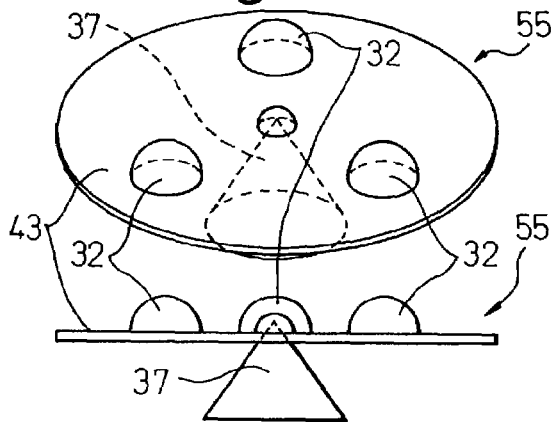
FIG. 6(c) consists of a perspective view and a side elevation view of a tilting wafer support member used in the third embodiment of a wafer holder according to the present invention.

The tilting wafer support member 41 may also be substituted with a wafer support member of a system wherein a conical depression is formed by spot facing work at the center of the bottom surface of the tabular member 43 and the wafer support member is held at the depression by the conical fulcrum 37, as in the tilting wafer support member 55 shown in FIG. 6(c). Further, in the case of the tilting wafer support member 36 shown in FIG. 5(b) or the tilting wafer support member 55 shown in FIG. 6(c), the conical fulcrum 37 may be formed as an integral part of the wafer support plate 21. As explained above, there is no particular restriction as to the shape and the structure of the fulcrum of the tilting wafer support member as far as the tilting movement of the wafer support member is not hindered.

Figure 6D:
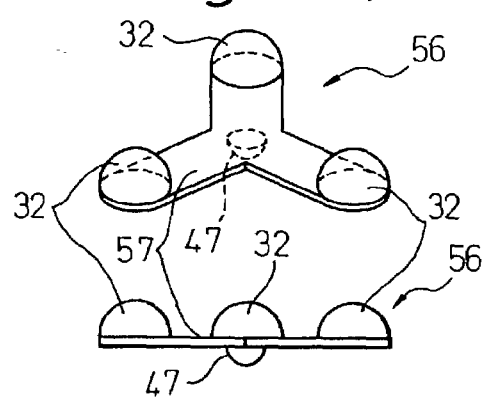
FIG. 6(d) consists of a perspective view and a side elevation view of a tilting wafer support member used in the third embodiment of a wafer holder according to the present invention.
Figure 7A:
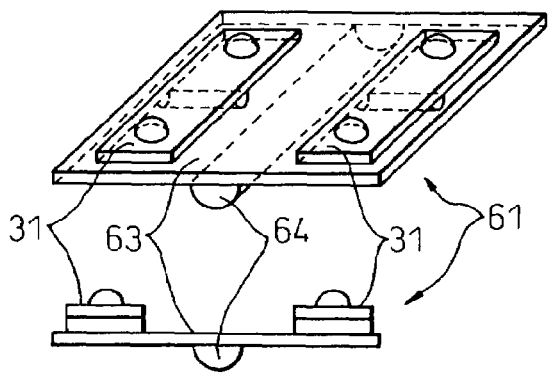
FIG. 7(a) consists of a perspective view and a side elevation view of tilting wafer support members used in the fourth embodiment of a wafer holder according to the present invention.
Figure 7B:
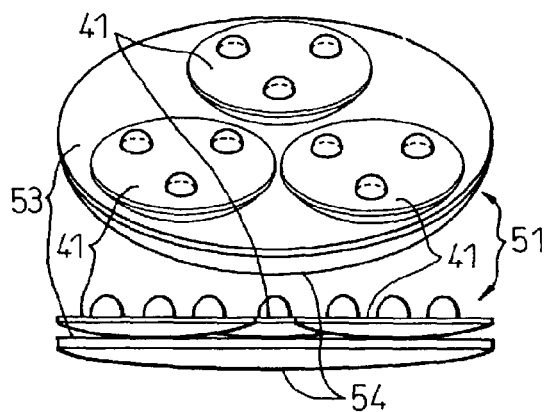
FIG. 7(b) consists of a perspective view and a side elevation view of tilting wafer support members used in the fourth embodiment of a wafer holder according to the present invention.

Additionally, the tilting wafer support member 41 of FIG. 3 may be substituted with a tilting wafer support member 56 wherein the tabular member 57 has a peripheral shape comprising a plurality of arms which link the fulcrum 47 to the wafer support portions 32 like the tilting wafer support member 56 shown in FIG. 6(d). As explained above, there is no particular restriction as to the shape of the tabular member of a tilting wafer support member as far as the tilting movement of the wafer support member is not hindered.

In addition, the number of the wafer support portions 32 provided on the upper surface of each of the tilting wafer support members 31, 36, 38, 41, 46, 55 and 56 disposed on the wafer support plate 21 may be four or more per one of the tilting wafer support member. In this case, among the four or more wafer support portions 32, two or three wafer support portions 32 are selected to support the wafer depending on the dimensional deviation. Therefore, it is possible to support a wafer with four or more wafer support portions as in the embodiments of the present invention shown in FIGS. 1 and 2.

Figure 4:
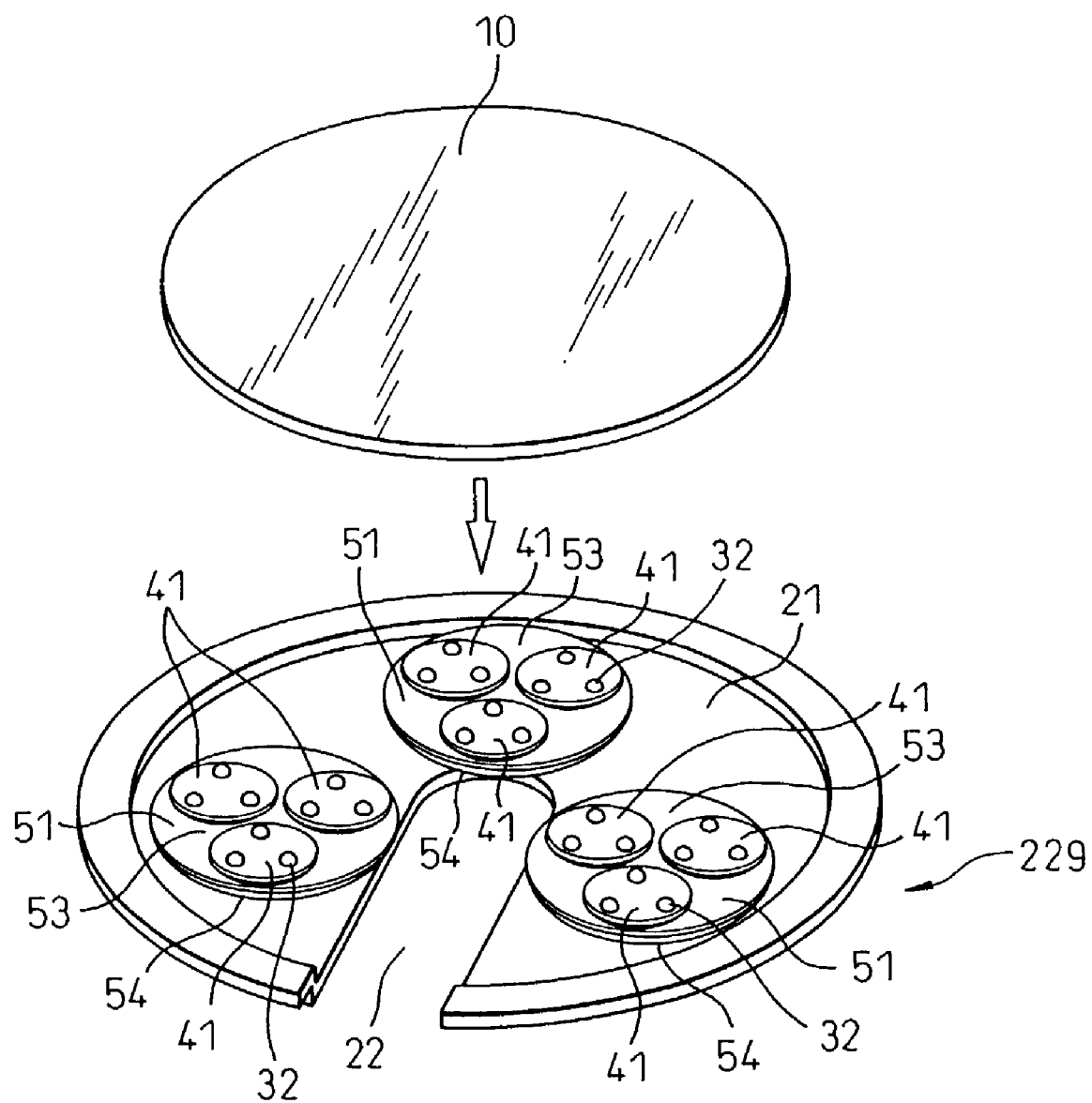
FIG. 4 is a perspective view of the fourth embodiment of a wafer holder according to the present invention.

FIG. 4 shows another different embodiment of the present invention using tilting wafer support members having another preferable structure.

In the wafer holder 229 according to the embodiment of the present invention shown in FIG. 4, three tilting support members 51 are disposed on the wafer support plate 21. In this case, the tilting support members are acceptable as long as each of these tilting support members has a flat upper surface and a fulcrum contacting with the wafer holder substantially at the center of the bottom surface at a point or along a line. Further, each of the tilting support members is constructed so that one or more tilting wafer support members, each having a plurality of wafer support portions as shown in FIGS. 5(*a*) to 5(*c*) and 6(*a*) to 6(*d*) for example, are allocated on the flat upper surface of the tilting support member. As another example of such a structure, the structure of the tilting support member 61 shown in FIG. 7(*a*) is given.

In the case of the structure shown in FIG. 4, three tilting wafer support members 41 are disposed on each of the tilting support members 51. Each of the tilting wafer support members 41 inclines slightly with respect to the upper surface 53 of the tilting support member 51 around the fulcrum 44 by receiving the weight of a wafer on the wafer support portions 32 in the above-mentioned wafer loading procedures. Further, each of the tilting support members 51 also inclines slightly with respect to the wafer support plate 21 around the fulcrum 54. As a result, in the case of the embodiment of the present invention shown in FIG. 4, each of the wafer support portions 32 changes its relative position in a self-adjusting manner until all of the twenty-seven wafer support portions 32 shown in FIG. 4 contact with the bottom surface of a wafer, and halts there.

Thanks to the above movement, in the embodiment of the present invention shown in FIG. 4, it is possible to support the wafer 10 with twenty-seven wafer support portions in a self-adjusting manner even when the wafer support plate 21 and the tilting support members 51 have dimensional deviations. Therefore, it becomes possible to further alleviate the stress formed at the supported portions of the wafer by the weight of the wafer, compared with the embodiments of the present invention shown in FIGS. 1 to 3.

Instead of the tilting wafer support members 41, various types of tilting wafer support members shown in FIGS. 5(*a*) to 5(*c*) and 6(*a*) to 6(*d*) for example, or a combination of these types may be placed on a tilting support member 51. Further, one or more of the various types of the tilting wafer support members shown in any one of FIGS. 5(*a*) to 5(*c*) and 6(*a*) to 6(*d*) and the fixed wafer support members 35 shown in FIG. 1 may be placed in combination on a tilting support member 51.

It is needless to say that various types of the tilting wafer support members shown in FIGS. 1 to 7(*a*) and 7(*b*) may be placed in combination on a wafer support plate 21. In this case, it is preferable that the designed heights of all the wafer support portions on the various types of the tilting wafer support members to be placed in combination are identical.

It is desirable that three wafer support members disposed on a wafer support portion 21 and used for supporting a wafer 10 are placed at three points in a manner that the vertical line from the center of the wafer 10 passes inside the triangle formed by the centers of the three wafer support members. More preferably, the three wafer support members are placed in the manner specified above and also at points distant from the center of the wafer support plate 21 by about 70% of the radius of the wafer 10.

There is no particular upper limit on the distance between any two wafer support portions 32 formed on the upper surface of a wafer support member, and any distance is acceptable if it allows the three wafer support members to be disposed on a wafer support plate 21 without overlapping each other. However, to make the fabrication of the wafer support members easier, it is desirable that the distance between wafer support portions 32 is 5 mm or more.

It is preferable that each of the wafer support portions 32 formed on the upper surface of the wafer support member is structured to support a wafer at a point. If the radius of curvature of the upper end of a wafer support portion 32 is too large, the frictional force between the wafer and the wafer support portion increases and, when the silicon wafer is heated in a heat treatment furnace while supported on the wafer holder, it may sometimes become difficult to alleviate the stress generated by the thermal deformation of the wafer holder at the supported portions of the wafer. As a result, there may occur slip deformations in the wafer. When the wafer is supported at points, however, the stress is alleviated and does not grow so large as to cause the slip dislocations.

It is further desirable that the top ends of a plurality of wafer support portions 32 formed on the upper surface of the wafer support members are formed to have a spherical surface having a radius of curvature of 100 mm or less.

As the wafer support members directly contact the silicon wafers, it is desirable that they are made of a material satisfying requirements such as: (a) its melting point is equal to or above the melting point of Si (1,410° C.); (b) its mechanical strength is sufficient for supporting the silicon wafer at temperatures not exceeding 1,410° C.; and (c) it is a solid material of a low contamination level in order to avoid contamination of the silicon wafers. SiC, $Si_3N_4$, $SiO_2$ and Si are named as examples of the material satisfying these requirements. Therefore, it is desirable that the material used for the wafer support members is any one selected from SiC, $Si_3N_4$, $SiO_2$ and Si, or a combination thereof.

It is desirable that the material of the wafer support portions 32 formed on the upper surface of the tilting wafer support members is not susceptible to deterioration, such as the formation of oxides even when exposed to an oxidizing atmosphere at a high temperature, in order to prevent the welding of the wafer support members with the silicon wafer, in addition to satisfying the above requirements. SiC and $Si_3N_4$ are named as examples of the material satisfying these requirements. Therefore, it is desirable that the material used for the wafer support portions 32 formed on the upper surface of the tilting wafer support members is SiC and/or $Si_3N_4$.

In the second place, the wafer holding movements of the second wafer holder according to the present invention and the effects are explained in detail referring to the embodiments of the present invention shown in FIGS. 8 to 11. The second wafer holder 261 or 262 according to the present invention is a holder to support a wafer on its upper surface, and is composed of a wafer support plate 21 and wafer support members 131, or 131 and 132 disposed on the wafer support plate 21. As seen in FIG. 8 for instance, four or more wafer support members are disposed on the wafer support plate 21. That is, four or more wafer support points are provided in order to prevent the occurrence of slip dislocations caused by the weight of the wafer. Further, the wafer support member is composed of three main structures, namely an upper structure, a middle structure and a lower structure. The upper and lower structures are made of a material which maintains the rigidity to withstand the weight of the silicon wafer during annealing treatment. The middle structure, on the other hand, is made of a material which has the rigidity to withstand the weight of the silicon wafer at room temperature but softens at a high temperature during annealing.

Generally speaking, when a wafer is supported at four or more points, the heights of all the support points have to be made uniform within a tolerance not exceeding 30 µm. However, in the case of the second wafer holder according to the present invention, as each of the wafer support members disposed on the wafer support plate has a middle structure being composed of a material which softens at a high temperature, the middle structure deforms as the annealing proceeds and, for this reason, the heights of the support points become uniform, in a self-adjusting manner, due to the weight of the wafer and, thus, the weight of the wafer is equally distributed to the support points. Further, even when the wafer holder deforms due to thermal stress, the equalization of the wafer weight loaded on each support point can be obtained by the same mechanism. In addition, even when the number of the wafer support members is further increased to five or more, the equalization of the wafer weight loaded on each the support point can be obtained by the same mechanism. Thus, the wafer support member according to the present invention is capable of easily coping with the latest trend of an increased wafer diameter, which means a larger wafer weight.

Figure 10:
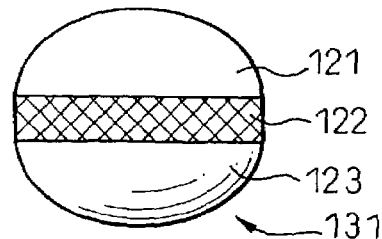
FIG. 10 is a sectional view showing an example of a wafer support member according to the present invention.
Figure 11:
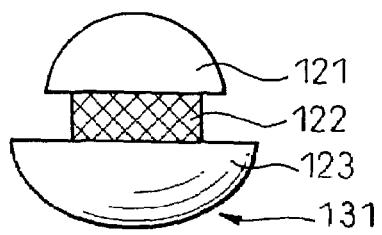
FIG. 11 is a sectional view showing another example of a wafer support member according to the present invention.

In the wafer support member composed of said three structures, it is desirable that each of the upper and lower structures is made of a material which maintains rigidity to withstand the weight of the silicon wafer during annealing treatment and does not weld with the silicon wafer and the wafer support plate. To be concrete, it is desirable that the material is any one selected from SiC, $Si_3N_4$, and Si coated with SiC and/or $Si_3N_4$ on the surface, or a combination thereof. The middle structure, on the other hand, needs to be made of a material which has the rigidity to withstand the weight of the wafer at room temperature and softens, but does not melt, at a high temperature during annealing. To be concrete, it is desirable that the middle structure is made of quartz glass. Further, it is desirable that the upper and lower ends of the wafer support member are formed convex to contact with the wafer and the wafer support plate at points, respectively. By supporting the weight at points, the possibility of the welding of the upper and lower ends of the wafer support member with the wafer and the wafer support plate can be reduced. To be concrete, it is desirable that each of the upper and lower ends of the wafer support member is formed to have a spherical surface having a radius of curvature not exceeding 100 mm. Further, it is necessary to avoid uneven deformation when the middle structure deforms. To make the fabrication of the wafer support members easier, it is also desirable that the bottom surface of the upper structure, the upper surface of the lower structure and the upper and bottom surfaces of the middle structure are all flat and parallel with each other. As far as the middle structure does not deform unevenly, its shape is not particularly restricted. But, in order to avoid the buckling of the middle structure, it is preferable that its width is larger than its height. The simplest structure of the wafer support member is that each of the upper and lower structures is shaped in a hemisphere and the middle structure in a cylindrical column as shown in FIG. 10. Though the upper and lower structures having the same shape are used in most cases, they may have different shapes and dimensions as seen in FIG. 11, as far as the requirements of the present invention are satisfied.

In the second wafer holder according to the present invention, conventional wafer support members not having the middle structure, such as those of spherical shape or pin shape, may be used instead of the wafer support members according to the present invention if the number of the conventional wafer support members is limited to one or two. Such an example is shown in FIG. 9. In the case that a wafer is supported with the wafer support members according to the present invention at the portions except the portion(s) where the wafer is supported by the conventional wafer support member(s), the wafer support members according to the present invention adjust the heights of the wafer support members and equal weight distribution is realized, and therefore, nearly the same effect as the case where the wafer support members according to the present invention are applied to all the wafer support members can be obtained. Fixed wafer support members integrated with the wafer support plate of a wafer holder may also be used in place of the conventional wafer support members. When a fixed wafer support member is used, it is desirable that the fixed wafer support member is made of SiC, $Si_3N_4$, or Si coated with SiC and/or $Si_3N_4$ on the surface.

In the third place, the effects of the third and fourth wafer holders according to the present invention are explained in detail referring to the embodiments of the present invention shown in FIGS. 12 to 18.

As already explained, in the third wafer holder 223 according to the present invention, the almost circular wafer support plate 211 has: an annular upward-convex support portion 221 having a flat upper surface; and a depression 231 running in the direction of the radius of the wafer support plate 211 and having a size (depth) which allows an automatic wafer conveying chuck to move vertically. An example of the wafer holder is shown in FIGS. 12 and 13. Note that it is desirable that the upward-convex support portion is formed in an annular shape so that it supports the wafer at a certain distance from the center of the wafer.

The wafer support plate 211 of the wafer holder 223 is provided with reinforcing ribs 222 to suppress deformation during heat treatment. In this embodiment, the wafer holder 223 has two reinforcing ribs 222 formed concentrically with the upward-convex support portion 221. In this embodiment, only one upward-convex support portion 221 is formed, but a plurality of the upward-convex support portions, such as two or three, may be formed annularly, preferably concentrically.

Figure 19:
FIG. 19 is a perspective view of a conventional wafer support plate.
Figure 20:
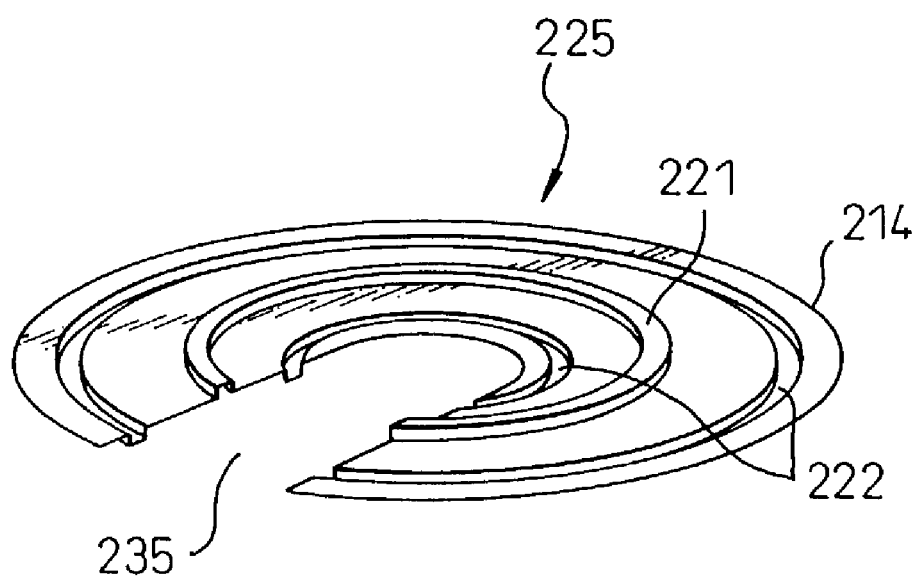
FIG. 20 is a perspective view of a conventional wafer holder.

FIGS. 19 and 20 show a conventional wafer support plate 213 and a conventional wafer holder 225. Comparing the conventional wafer support plate 213 and the conventional wafer holder 225 with the wafer holder 223 according to the present invention, it is seen that whereas the conventional wafer support plate 213 and the wafer support plate 214 of the conventional wafer holder 225 have the notches 234 and 235 respectively, the wafer holder 223 has a structure wherein the notch is linked with the depression 231 which enables the automatic conveyance of the wafer as described before.

The conventional wafer support plate 213 or the wafer support plate 214 of the conventional wafer holder 225 has the notch 234 or 235 respectively, and the notch 234 or 235 causes large deformation during heat treatment, which results in welding of the wafer support plate 213 or the wafer support plate 214 of the wafer holder 225 with the wafer and, as a consequence, increases the stress imposed on the wafer.

On the other hand, in the case of the wafer holder 223 according to the present invention, the portion corresponding to the notch 234 or 235 is linked with the depression 231 which enables the automatic conveyance of the wafer. For this reason, the deformation of the wafer holder 223 during heat treatment is small and, even if the wafer welds with the wafer holder 223, the generated stress is suppressed and, therefore, the occurrence of the slip dislocations is prevented.

The deformation can also be suppressed through the combination of a ring-shaped wafer holder and a wafer conveying method using the combination of vertically moving pins and an automatic wafer conveying chuck. However, if the space for upward and downward movement required for the wafer conveying method using the combination of the vertically moving pins and the automatic wafer conveying chuck is large, the above combination method offers only a second best solution.

In the fourth wafer holder 224 of the present invention, as already explained, the almost circular wafer support plate 212 has: an annular upward-convex support portion 221 having a flat upper surface; a notch 232 which allows an automatic wafer conveying chuck to move vertically; and a tabular reinforcing structure 233 to suppress deformation during heat treatment. The reinforcing structure 233 is composed of a sheet formed perpendicularly to the wafer loading face. An example of the wafer holder is shown in FIGS. 17 and 18.

In this embodiment, only one upward-convex support portion 221 is formed, but a plurality of the upward-convex support portions, such as two or three, may be formed annularly, preferably concentrically. The wafer holder 212 is further provided with reinforcing ribs 222 to suppress deformation during heat treatment. In this embodiment, two reinforcing ribs 222 are formed concentrically with the upward-convex support portion 221 like the one shown in FIGS. 12 and 13.

In the case of the wafer support plate 212 of the wafer holder 224 of this embodiment, the deformation during heat treatment is suppressed by the tabular reinforcing structure 233 and, hence, the slip dislocations are prevented from occurring, as in the first embodiment described before. Since the deformation of the wafer holder 224 during heat treatment is small, even if the wafer welds with the wafer holder 224, the generated stress is suppressed and, therefore, the occurrence of the slip dislocations is prevented.

EXAMPLE

Examples of the present invention are explained hereafter.

Invented Example 1, Comparative Example 1

The present inventors carried out a test to confirm whether the first wafer holder, the wafer boat and the heat treatment furnace according to the present invention would demonstrate intended effects. The tilting wafer support members 31, 36, 38, 41, 46, 51, 55, 56 and 61 and the fixed wafer support members 35 shown in FIGS. 1 to 7 were used for the test.

When fabricating the above-mentioned types of tilting wafer support members, the distance between the wafer support portions 32 provided on the upper surfaces of the tilting wafer support members was set within the range from 5 to 40 mm. The various types of the tilting wafer support members were disposed on the upper surface of the wafer support plate 21 at positions distant from the center of the wafer support plate 21 by about 70% of the radius of the wafer 10. Also, the tilting wafer support members were disposed in a manner that the polygon obtained by connecting the centers of the tilting wafer support members forms a regular polygon. However, when a vertex of the regular polygon fell within the notch 22 formed on the wafer support plate 21, the position of the corresponding tilting wafer support member was shifted outside the notch 22. After disposing the tilting wafer support members on the wafer support plates 21, the wafer support plates 21 were loaded onto a vertical boat, and the boat was charged into a vertical heat treatment furnace.

8-inch silicon wafers (200 mm in diameter) and 12-inch silicon wafers (300 mm in diameter) were used for the test. The occurrence of the slip dislocations was investigated after a heat treatment at 1,200° C. for 12 h. in a 100% Ar atmosphere or a heat treatment at 1,390° C. for 12 h. in a dry oxidation atmosphere in the vertical heat treatment furnace.

Figure 22:
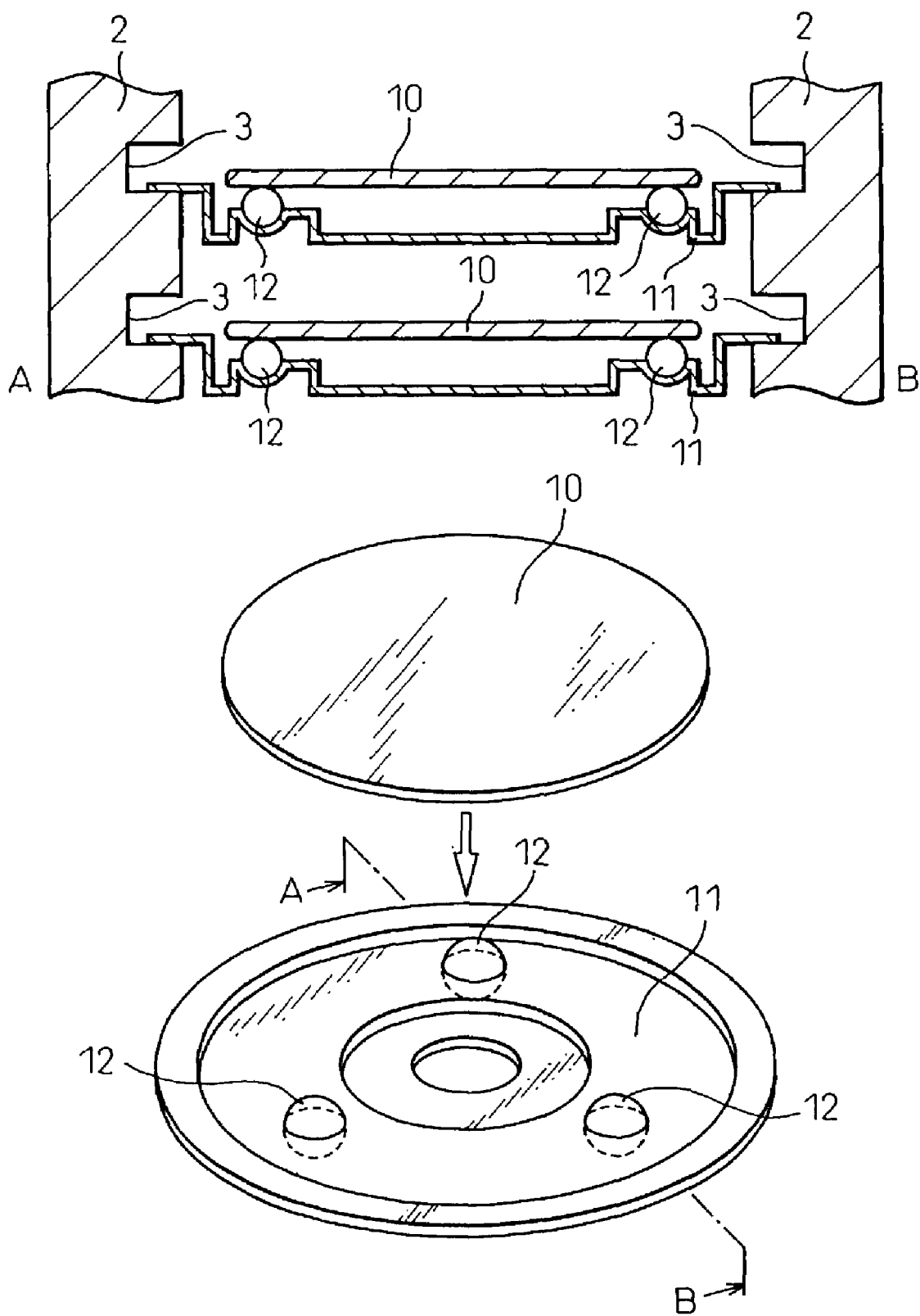
FIG. 22 consists of a perspective view and a section view taken on line A-B of a conventional wafer holder.

Further, as comparative examples to the present invention, the same heat treatment was carried out using the wafer holder shown in FIG. 22 which was disclosed in the Japanese Unexamined Patent Publication No. 2000-91406, and the occurrence of the slip dislocations was compared with that of the examples of the present invention. In this case, the diameter of the silicon balls 12 was 3 mm and the number of the silicon balls 12 disposed on the wafer support plate 11 was 3 to 5. The heat treatment was carried out with the silicon balls disposed at positions distant from the center of the wafer support plate 11 by about 70% of the radius of the wafer 10 in a manner that the polygon obtained by connecting the centers of the silicon balls formed a regular polygon.

The occurrence or otherwise of the slip dislocations was confirmed by X-ray topography. Details of the other test conditions are listed in Table 1. The evaluation marks in Table 1 indicate as follows: ○ no slip dislocations, Δ slight slip dislocations detected, and X heavy slip dislocations detected.

As seen in Table 1, while examples according to the present invention (B1 to B24) show the evaluation mark ○ in the 1,200° C. Ar atmosphere on every test condition, comparative examples (A1 to A6) show only the mark Δ or X. Further, while most of the examples according to the present invention in which the radius of curvature of the wafer support portions is 100 mm or less and their material is SiC or $Si_3N_4$ (B1 to B5, B8, B9, and B11 to B24) show the evaluation mark ○ with only a few exceptions showing the evaluation mark Δ even in the 1,390° C. oxidizing atmosphere, all the comparative examples show the evaluation mark X. Thus, the wafer holder, the wafer boat and the heat treatment furnace according to the present invention are confirmed to have distinct improvement effects with regard to the occurrence of the slip dislocations compared with the conventional technology disclosed in Japanese Unexamined Patent Publication No. 2000-91406.

TABLE 1

| | Wafer diameter (mm) | Support member Type | Support member Number of pieces | Total number | Support portion Distance between Pieces | Support portion Radius of curvature (mm) | Material for support member/ portion | Occurrence of slip dislocations 1200 °C. Ar | Occurrence of slip dislocations 1390 °C. CO$_2$ | Remarks |
|---|---|---|---|---|---|---|---|---|---|---|
| A1 | 200 | Si ball | 3 | 3 | — | 1.5 | Si single crystal | Δ | X | Comparative example |
| A2 | | | 4 | 4 | | | | X | X | |
| A3 | | | 5 | 5 | | | | Δ | X | |
| B1 | 200 | Support member 31, 35 | Support member 31 → 1 unit Support member 35 → 2 units | 4 | 30 | 1.5 | SiC | ○ | Δ | Inventive example |
| B2 | | Support member 31 | 3 | 6 | 30 | 1.5 | SiC | ○ | ○ | |
| B3 | | | | | | 5 | | ○ | ○ | |
| B4 | | | | | | 20 | | ○ | ○ | |
| B5 | | | | | | 100 | | ○ | ○ | |
| B6 | | | | | | 150 | | ○ | Δ | |
| B7 | | | | | | 300 | | ○ | X | |
| B8 | | Support member 36 | 3 | 6 | 30 | 1.5 | SiC | ○ | ○ | |
| B9 | | Support member 38 | 3 | 6 | 30 | 1.5 | SiC | ○ | ○ | |
| B10 | | Support member 41 | 3 | 9 | 20 | 1.5 | Si single crystal | ○ | X | |
| B11 | | | | | | | Si single crystal coated with Si$_3$N$_4$ film | ○ | ○ | |
| B12 | | | | | | | Si single crystal coated with SiC film | ○ | ○ | |
| B13 | | | | | | 5 | SiC | ○ | ○ | |
| B14 | | | | | | 10 | | ○ | ○ | |
| B15 | | | | | | 20 | | ○ | ○ | |
| B16 | | | | | | 40 | | ○ | ○ | |
| B17 | | | 5 | 15 | 20 | | | ○ | ○ | |
| B18 | | Support member 46 | 3 | 9 | 20 | 1.5 | SiC | ○ | ○ | |
| B19 | | Support member 55 | 3 | 9 | 20 | 1.5 | SiC | ○ | ○ | |
| B20 | | Support member 56 | 3 | 9 | 20 | 1.5 | SiC | ○ | ○ | |
| A4 | 300 | Si ball | 3 | 3 | — | 1.5 | Si single crystal | X | X | Comparative example |
| A5 | | | 4 | 4 | | | | X | X | |
| A6 | | | 5 | 5 | | | | Δ | X | |
| B21 | 300 | Support member 31 | 3 | 6 | 20 | 1.5 | SiC | ○ | Δ | |
| B22 | | Support member 41 | | 9 | 20 | 1.5 | | ○ | ○ | |
| B23 | | Support members 61, 31 | Support member 61 → 3 units Support member 31 → 6 units | 12 | 10 | 1.5 | SiC | ○ | ○ | Inventive example |
| B24 | | Support member 51, 41 | Support member 51 → 3 units Support member 41 → 9 units | 27 | | | | ○ | ○ | |

Inventive Example 2, Comparative Example 2

The present inventors carried out a test to confirm whether the second wafer holder, the wafer boat and the heat treatment furnace according to the present invention would demonstrate intended effects. The support members fabricated for the test were of the type shown in FIG. 10 and, to be concrete, each of them had an upper structure and a lower structure made of SiC and shaped in hemispheres having a diameter of 10 mm, a height of 5 mm and a radius of curvature of 5 mm, and a middle structure made of quartz glass and shaped in a cylindrical column having a diameter of 10 mm and a height of 5 mm. The upper, middle and lower structures were put together as one piece. Support members made of SiC of about the same size as the above integrated support members were also fabricated and used for the test. The wafer holders used for the test were of the type shown in FIG. 8, having a disc shape and made of SiC. The wafer holders shown in FIG. 9 having fixed support members were also used. The wafer holders for the 8-inch silicon wafers were 220 mm in diameter and those for the 12-inch silicon wafers 320 mm in diameter. The support members were disposed at positions distant from the center of the wafer holder by 70% of the radius of the wafer and in a manner that the polygon obtained by connecting the support points formed a regular polygon.

8-inch silicon wafers (200 mm in diameter) and 12-inch silicon wafers (300 mm in diameter) were used for the test. The occurrence or otherwise of the slip dislocations was investigated using X-ray topography after a heat treatment at 1,390° C. for 12 h. in a dry oxidation atmosphere. The results are listed in Table 2.

The evaluation marks in the table indicate as follows: ○ no slip dislocations, Δ slight slip dislocations detected, and X heavy slip dislocations detected. As seen in the table, while most of comparative examples C1 to C6 show the evaluation mark Δ or X, all of the inventive examples D1 to D8 show the evaluation mark ○, which demonstrates that the present invention is extremely effective for preventing the slip dislocations.

TABLE 2

| Test No. | Wafer diameter (mm) | Number of support members | Number of inventive support members | Number of support members other than Inventive ones | Occurrence of slip dislocations | Remarks |
| --- | --- | --- | --- | --- | --- | --- |
| C1 | 200 | 3 | 0 | 3 | X | Comparative example |
| C2 | 200 | 3 | 3 | 0 | Δ | Comparative example |
| C3 | 200 | 4 | 0 | 4 | X | Comparative example |
| C4 | 200 | 4 | 1 | 3 | Δ | Comparative example |
| D1 | 200 | 4 | 2 | 2 | ○ | Inventive example |
| D2 | 200 | 4 | 3 | 1 | ○ | Inventive example |
| D3 | 200 | 4 | 4 | 0 | ○ | Inventive example |
| C5 | 300 | 3 | 3 | 0 | X | Comparative example |
| C6 | 300 | 4 | 0 | 4 | X | Comparative example |
| D4 | 300 | 4 | 3 | 1 | ○ | Inventive example |
| D5 | 300 | 4 | 4 | 0 | ○ | Inventive example |
| D6 | 300 | 5 | 3 | 2 | ○ | Inventive example |
| D7 | 300 | 5 | 4 | 1 | ○ | Inventive example |
| D8 | 300 | 5 | 5 | 5 | ○ | Inventive example |

Inventive Example 3, Comparative Example 3

The present inventors carried out a test to confirm the effects of the present invention, using the third and fourth wafer holders 223 and 224 according to the present invention and the conventional wafer support plate 213 and conventional wafer holder 225.

All of the wafer support plates 211 and 212 of the wafer holders 223 and 224, the wafer support plate 213 and the wafer support plate 214 of the wafer holder 225 were made of SiC and had an outer diameter of 9 inches (225.4 mm) and a thickness of 1 mm.

The width of the depression 231 of the wafer support plate 211 of the wafer holder 223 which allows an automatic wafer conveying chuck to move vertically and that of the notch 232 formed in the wafer support plate 212 of the wafer holder 224 were both 50 mm. The width of the notches 234 and 235 of the wafer support plate 213 and the wafer support plate 214 of the wafer holder 225 was also 50 mm.

The upward-convex support portions 221 of the wafer support plates 211 and 212 of the wafer holders 223 and 224 were provided at the positions distant from the centers of the respective wafer support plates by 70 to 75% of the radius of an 8-inch (200 mm) wafer, the inner reinforcing ribs 222 were provided at the positions distant from the same by 50 to 53% of the radius thereof, and the outer reinforcing ribs 222 were provided at the positions distant from the same by 99 to 101% of the radius thereof. The upward-convex support portion 221 had a section with a flat top surface 5 mm in width and 4 mm in height and the reinforcing ribs had the concave with a section 5 mm in width and 3 mm in depth.

The wafer holders 223 and 224, wafer support plate 213 and wafer holder 225, each holding an 8-inch (200 mm) silicon wafer, were subjected to the heat treatment at 1,350° C. for 24 h. in a 100% oxygen atmosphere. Table 3 shows the results of the investigation of the slip dislocations using X-ray topography after the test.

As seen in Table 3, whereas no slip dislocations are detected after the test in the cases of the wafer holders 223 and 224 according to the present invention (E1 and E2), the slip dislocations occur with the conventionally structured wafer support plate 213 and wafer holder 225 (F1 and F2). This result shows that the wafer holders according to the present invention are capable of preventing slip dislocations from occurring in the wafers during high temperature heat treatment.

TABLE 3

| | | Occurrence of slip dislocations | Remarks |
|---|---|---|---|
| F1 | Wafer holder 223 | Nil | Inventive example |
| E2 | Wafer holder 224 | Nil | Inventive example |
| F1 | Wafer support plate 213 | Slight | Comparative example |
| F2 | Wafer holder 225 | Heavy | Comparative example |

INDUSTRIAL APPLICABILITY

As described above, the present invention can provide industrially viable and low-cost wafer holders suitable for the heat treatment of silicon wafers and, in particular, a high temperature heat treatment employed for the production of the SIMOX wafers, annealed wafers and the like, and capable of preventing slip dislocations from occurring in the silicon wafers.

Further, the present invention can provide a wafer boat and a heat treatment furnace capable of preventing slip dislocations from occurring in the silicon wafers while maintaining high productivity by using said wafer holders.

The invention claimed is:

1. A wafer holder to hold a wafer on the upper surface characterized in that: the wafer holder comprises a wafer support plate and three or more wafer support members mounted on said wafer support plate, wherein said wafer support members maintain rigidity and each having one or more wafer support portions; wherein said wafer support members are fabricated from a material selected from the group consisting of SiC, $Si_3N_4$, Si and combinations thereof; at least one of said wafer support members is a tilting wafer support member which has a plurality of upward-convex wafer support portions on the upper surface; and is tiltable by a fulcrum located between said tilting wafer support member and the wafer support plate with respect to the wafer support plate; and the wafer is supported by at least four wafer support portions by point contact; including point contact by the upward-convex wafer support portions located on said upper surface of said tilting wafer support member.

2. A wafer holder according to claim 1, characterized in that the tilting wafer support member comprises: a tabular member; a fulcrum provided substantially at the center of the bottom surface of the tabular member and contacting with said wafer support plate at a point or along a line; and upward-convex wafer support portions provided on the upper surface of the tabular member and on both sides of the fulcrum contacting with the wafer support plate.

3. A wafer holder according to claim 1, characterized in that the tilting wafer support member comprises: a tabular member; a fulcrum provided substantially at the center of the bottom surface of the tabular member and contacting with said wafer support plate at a point; and three upward-convex wafer support portions provided on the upper surface of the tabular member.

4. A wafer holder to hold a wafer on the upper surface characterized by comprising: a wafer support plate; three or more wafer support members placed on said wafer support plate, at least one of which is a first tilting wafer support member having a flat upper surface and a fulcrum provided substantially at the center of the bottom surface and contacting the wafer support plate at a point or along a line and being tiltable with respect to the wafer support plate; and at least one second tilting wafer support member located above the flat upper surface of said first tilting wafer support member, said second tilting wafer support member having an upper surface and bottom surface, a fulcrum provided substantially at the center of the bottom surface of said second tilting wafer support member and contacting with said first tilting wafer support member on its flat upper surface at a point or along a line, and a plurality of upward-convex wafer support portions provided on the upper surface of said second tilting wafer support member, wherein each of said wafer support members maintains rigidity, wherein said wafer support members are fabricated from a material selected from the group consisting of SiC, $Si_3N_4$, Si and combinations thereof; and the wafer is supported by at least four wafer support portions by point contact; including point contact by the upward-convex wafer support portions located on said upper surface of said second tilting wafer support member.

5. A wafer holder according to any one of claims 1 to 4, characterized in that the material of the wafer support portions of the wafer support members is SiC and/or $Si_3N_4$.

6. A wafer holder according to any one of claims 1 to 4, characterized in that the wafer support plate of said wafer holder is a circular plate with a notch.

7. A wafer holder according to any one of claims 1 to 4, characterized in that the material of a tabular wafer support plate of said wafer holder is: any one selected from SiC, $Si_3N_4$, Si, and Si coated SiC and/or $Si_{3N4}$ on the surface; or a combination thereof.

8. A wafer boat to hold a plurality of wafers characterized by comprising: at least two fixed members; a plurality of support columns placed between the fixed members and substantially in parallel with each other; a plurality of support grooves formed in the support columns; and the wafer holders according to any one of claims 1 to 4, horizontally inserted in and held by the support grooves.

9. A heat treatment furnace for wafers characterized by being equipped with a wafer boat according to claim 8.

10. A wafer holder according to claim 1, wherein two upward-convex wafer support portions are located on the upper surface of said tilting wafer support member.

11. A wafer holder according to claim 4, wherein two upward-convex wafer support portions are located on the upper surface of said second tilting wafer support member.

* * * * *